United States Patent
Burak

(10) Patent No.: US 9,525,397 B2
(45) Date of Patent: Dec. 20, 2016

(54) ACOUSTIC RESONATOR COMPRISING ACOUSTIC REFLECTOR, FRAME AND COLLAR

(71) Applicant: Avago Technologies General IP (Singapore) Pte. Ltd., Singapore (SG)

(72) Inventor: Dariusz Burak, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 111 days.

(21) Appl. No.: 14/180,596

(22) Filed: Feb. 14, 2014

(65) Prior Publication Data

US 2014/0232486 A1 Aug. 21, 2014

Related U.S. Application Data

(63) Continuation-in-part of application No. 13/955,774, filed on Jul. 31, 2013, now Pat. No. 9,246,473, which
(Continued)

(51) Int. Cl.
*H03H 9/17* (2006.01)
*H03H 9/02* (2006.01)
(Continued)

(52) U.S. Cl.
CPC ...... *H03H 9/02118* (2013.01); *H03H 9/02102* (2013.01); *H03H 9/132* (2013.01);
(Continued)

(58) Field of Classification Search
CPC .......... H03H 9/132; H03H 9/175; H03H 9/54; H03H 9/02102; H03H 9/02118; H03H 9/171
(Continued)

(56) References Cited

U.S. PATENT DOCUMENTS

| 4,975,892 A | 12/1990 | Defranould et al. |
| 5,587,620 A | 12/1996 | Ruby et al. |

(Continued)

FOREIGN PATENT DOCUMENTS

| EP | 2299593 | 3/2011 |
| JP | 6165507 | 4/1986 |

(Continued)

OTHER PUBLICATIONS

Tang, et al. "Micromachined Bulk Acoustic Resonator with a Raised Frame", 16th International Conference on Mechatronics Technology, Oct. 16-19, 2012, Tianjin, China.
(Continued)

*Primary Examiner* — Barbara Summons
*Assistant Examiner* — Jorge Salazar, Jr.

(57) ABSTRACT

A solidly mounted resonator (SMR) device includes an acoustic reflector having stacked acoustic reflector layer pairs, each of which includes a low acoustic impedance layer formed of low acoustic impedance material stacked on a high acoustic impedance layer formed of high acoustic impedance material. The SMR device further includes a bottom electrode disposed on the acoustic reflector, a piezoelectric layer disposed on the bottom electrode, and a top electrode disposed on the piezoelectric layer. A collar is formed outside a main active region defined by an overlap between the top electrode, the piezoelectric layer and the bottom electrode, and at least one frame is disposed within the main active region. The collar has an inner edge substantially aligned with a boundary of or overlapping the main active region, and the at least one frame has an outer edge substantially aligned with the boundary of the main active region.

20 Claims, 15 Drawing Sheets

Related U.S. Application Data is a continuation-in-part of application No. 13/781,491, filed on Feb. 28, 2013, which is a continuation-in-part of application No. 13/663,449, filed on Oct. 29, 2012, now Pat. No. 9,401,692, which is a continuation-in-part of application No. 13/208,883, filed on Aug. 12, 2011, now Pat. No. 9,083,302, which is a continuation-in-part of application No. 13/074,262, filed on Mar. 29, 2011.

(51) Int. Cl.
  *H03H 9/54* (2006.01)
  *H03H 9/13* (2006.01)
(52) U.S. Cl.
  CPC ............ *H03H 9/171* (2013.01); *H03H 9/175* (2013.01); *H03H 9/54* (2013.01)
(58) Field of Classification Search
  USPC .................. 333/133, 186, 187, 188; 310/312
  See application file for complete search history.

(56) References Cited

U.S. PATENT DOCUMENTS

| | | | |
|---|---|---|---|
| 5,873,153 A | 2/1999 | Ruby et al. | |
| 6,107,721 A | 8/2000 | Lakin | |
| 6,150,703 A | 11/2000 | Cushman et al. | |
| 6,384,697 B1 | 5/2002 | Ruby | |
| 6,396,200 B2 | 5/2002 | Misu et al. | |
| 6,424,237 B1 | 7/2002 | Ruby et al. | |
| 6,466,105 B1 * | 10/2002 | Lobl et al. | 333/187 |
| 6,507,983 B1 | 1/2003 | Ruby et al. | |
| 6,548,943 B2 | 4/2003 | Kaitila et al. | |
| 6,617,751 B2 | 9/2003 | Sunwoo et al. | |
| 6,788,170 B1 * | 9/2004 | Kaitila ................. H03H 9/173 310/326 |
| 6,820,469 B1 | 11/2004 | Adkins et al. | |
| 6,941,036 B2 | 9/2005 | Lucero | |
| 6,985,051 B2 | 1/2006 | Nguyen et al. | |
| 7,129,806 B2 | 10/2006 | Sato | |
| 7,179,392 B2 | 2/2007 | Robert et al. | |
| 7,233,218 B2 | 6/2007 | Park et al. | |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,385,334 B1 * | 6/2008 | Olsson et al. ................ 310/322 |
| 7,388,454 B2 | 6/2008 | Ruby et al. | |
| 7,466,213 B2 | 12/2008 | Lobl et al. | |
| 7,468,608 B2 | 12/2008 | Feucht et al. | |
| 7,508,286 B2 | 3/2009 | Ruby et al. | |
| 7,576,471 B1 | 8/2009 | Solal | |
| 7,616,079 B2 | 11/2009 | Tikka et al. | |
| 7,629,865 B2 | 12/2009 | Ruby | |
| 7,636,026 B2 | 12/2009 | Heinze et al. | |
| 7,649,304 B2 | 1/2010 | Umeda et al. | |
| 7,714,684 B2 * | 5/2010 | Ruby ...................... H03H 3/02 310/322 |
| 7,758,979 B2 * | 7/2010 | Akiyama ............. B81B 3/0021 428/698 |
| 7,768,364 B2 | 8/2010 | Hart et al. | |
| 7,795,781 B2 | 9/2010 | Barber et al. | |
| 7,869,187 B2 | 1/2011 | McKinzie et al. | |
| 7,889,024 B2 | 2/2011 | Bradley et al. | |
| 7,966,722 B2 | 6/2011 | Hart et al. | |
| 7,978,025 B2 | 7/2011 | Yokoyama et al. | |
| 8,008,993 B2 | 8/2011 | Milsom et al. | |
| 8,030,823 B2 | 10/2011 | Sinha et al. | |
| 8,222,795 B2 | 7/2012 | Sinha et al. | |
| 8,384,497 B2 | 2/2013 | Zhang | |
| 2001/0045793 A1 | 11/2001 | Misu et al. | |
| 2002/0153965 A1 | 10/2002 | Ruby et al. | |
| 2003/0227357 A1 | 12/2003 | Metzger et al. | |
| 2004/0027216 A1 | 2/2004 | Ma et al. | |
| 2005/0093397 A1 | 5/2005 | Yamada et al. | |
| 2005/0206479 A1 | 9/2005 | Nguyen et al. | |
| 2006/0017352 A1 | 1/2006 | Tanielian | |
| 2006/0071736 A1 | 4/2006 | Ruby et al. | |
| 2006/0114541 A1 | 6/2006 | Van Beek | |
| 2006/0176126 A1 | 8/2006 | Wang et al. | |
| 2006/0284706 A1 | 12/2006 | Ginsburg et al. | |
| 2007/0085632 A1 | 4/2007 | Larson et al. | |
| 2007/0205850 A1 | 9/2007 | Jamneala et al. | |
| 2008/0129414 A1 | 6/2008 | Lobl et al. | |
| 2008/0258842 A1 | 10/2008 | Ruby et al. | |
| 2009/0001848 A1 | 1/2009 | Umeda et al. | |
| 2009/0102319 A1 | 4/2009 | Nakatsuka et al. | |
| 2009/0127978 A1 | 5/2009 | Asai et al. | |
| 2009/0153268 A1 | 6/2009 | Milsom et al. | |
| 2009/0267457 A1 | 10/2009 | Barber et al. | |
| 2010/0033063 A1 | 2/2010 | Nishihara et al. | |
| 2010/0052815 A1 | 3/2010 | Bradley et al. | |
| 2010/0091370 A1 | 4/2010 | Mahrt et al. | |
| 2010/0107389 A1 | 5/2010 | Nessler et al. | |
| 2010/0148637 A1 | 6/2010 | Satou | |
| 2010/0187948 A1 | 7/2010 | Sinha et al. | |
| 2010/0260453 A1 | 10/2010 | Block | |
| 2010/0327697 A1 | 12/2010 | Choy et al. | |
| 2010/0327994 A1 | 12/2010 | Choy et al. | |
| 2011/0080233 A1 * | 4/2011 | Petit ................ H03H 9/02102 333/187 |
| 2011/0084779 A1 | 4/2011 | Zhang | |
| 2011/0121916 A1 | 5/2011 | Barber et al. | |
| 2011/0148547 A1 * | 6/2011 | Zhang ................ 333/187 |
| 2011/0204996 A1 | 8/2011 | Gilbert et al. | |
| 2012/0154074 A1 | 6/2012 | Ruby et al. | |
| 2012/0161902 A1 | 6/2012 | Feng et al. | |
| 2012/0177816 A1 | 7/2012 | Larson et al. | |
| 2012/0194297 A1 | 8/2012 | Choy | |
| 2012/0218055 A1 | 8/2012 | Burak et al. | |
| 2012/0218056 A1 | 8/2012 | Burak | |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2012/0248941 A1 | 10/2012 | Shirakawa et al. | |
| 2012/0280767 A1 | 11/2012 | Burak et al. | |
| 2013/0106534 A1 | 5/2013 | Burak et al. | |
| 2013/0241673 A1 | 9/2013 | Yokoyama et al. | |
| 2013/0300259 A1 | 11/2013 | Sinha et al. | |
| 2013/0314177 A1 | 11/2013 | Burak et al. | |

FOREIGN PATENT DOCUMENTS

| | | |
|---|---|---|
| JP | 2003/017964 | 1/2003 |
| JP | 2003017964 | 1/2003 |
| JP | 2007/028669 | 2/2007 |
| JP | 2007-208845 | 8/2007 |
| JP | 2008-131194 | 6/2008 |
| JP | 2008-211394 | 9/2008 |

OTHER PUBLICATIONS

Tuomas Pensala, "Thin Film Bulk Acoustic Wave DevicesPerformance Optimization and Modeling", VTT Publications 756, Feb. 2011, pp. 1-106.
Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Co-pending U.S. Appl. No. 13/781,491, filed Feb. 28, 2013.
Keiichi Umeda et al, "Piezoelectric Properties of ScAlN Thin Films for Piezo-Mems Devices", MEMS 2013, Taipei, Taiwan, Jan. 20-24, 2013, pp. 733-736.
Co-pending U.S. Appl. No. 14/092,077, filed Nov. 27, 2013.
Co-pending U.S. Appl. No. 13/766,993, filed Feb. 14, 2013.
Co-pending U.S. Appl. No. 13/662,425, filed Oct. 27, 2012.
Co-pending U.S. Appl. No. 13/662,460, filed Oct. 27, 2012.
Co-pending U.S. Appl. No. 13/767,754, filed Feb. 14, 2013.
Co-pending U.S. Appl. No. 13/955,774, filed Jul. 31, 2013.

(56) References Cited

OTHER PUBLICATIONS

"Co-pending U.S. Appl. No. 12/710,640, filed Feb. 23, 2010".
"Co-pending U.S. Appl. No. 13/036,489, filed Feb. 28, 2011".
"Co-pending U.S. Appl. No. 13/074,094, filed Mar. 29, 2011".
"Co-pending U.S. Appl. No. 13/074,262, filed Mar. 29, 2011".
"Co-pending U.S. Patent Application No. 13, Oct. 18, 2012".
"Co-pending U.S. Appl. No. 13/101,376, filed May 5, 2011".
"Co-pending U.S. Appl. No. 13/161,946, filed Jun. 16, 2011".
"Co-pending U.S. Appl. No. 13/286,038, filed Oct. 31, 2011".
Allaha, Mohamed A., "Solidly Mounted BAW Resonators With Layer-Transferred AlN Using Sacrificial Si Surfaces", *Solid State Electronics*, ESSDERC 2009 Conference, vol. 54, Issue ( Sep. 2010 , 1041-1046.
Bi, F.Z., "Bulk Acoustic Wave RF Technology", *IEEE Microwave Magazine*, vol. 9, Issue 5. 2008 , 65-80.
Dubois, M A., "Solidl Mounted Resonator Based on Aluminum Nitride Thin Film", *1998 IEEE Ultrasonics Symposium* vol. 1 1998, 909-912.
Lee, et al., "Development of High-Auality FBAR Devices for Wireless Applications Employing Two-Step Annealing Treatments", *IEEE Microwave and Wireless Components Letters*, vol. 21 No. 11 Nov. 2011.
Lee,. Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004 , 278-281.
Martinez, et al., "High confinement suspended micro-ring resonators in silicon-on-insulator", *Optics Express*, Vo. 14, No. 13 Jun. 26, 2006 , 6259-6263.
Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007 , 880-885.
Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009 , 1731-1744.
Strijbos, R., "Design and Characterisation of High-Q Solidly-Mounted Bulk Acoustic Wave Filters", *ECTC '07. Proceedings. 57th Electronic Components and Technology Conference, Publication Year 2007* 2007 , 169-174.
Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010 , 448-454.
"IEEE Xplore Abstract for Suppression of Acoustic Energy Leakage in FBARS with Al Bottom Electrode: FEM Simulation and Experimental Results", Oct. 28-31, 2007, 2 pages.
"Machine Translation of JP 2007-208845", Aug. 16, 2007, 1-9.
"Machine Translation of JP 2008-211394", Sep. 11, 2008, 1-8.
Ohara, et al., "Suppression of Acoustic Energy Leakage in FBARs with Al Bottom Electrode: FEM Simulation and Experimental Results", 2007 IEEE Ultrasonics Symposium,, Oct. 28-31, 2007, 1657-1660.

\* cited by examiner

ACOUSTIC RESONATOR COMPRISING ACOUSTIC REFLECTOR, FRAME AND COLLAR

CROSS REFERENCE TO RELATED APPLICATIONS

This application is a continuation-in-part under 37 C.F.R. §1.53(b) of commonly owned U.S. patent application Ser. No. 13/955,774 entitled "Acoustic Resonator Comprising Collar, Frame and Perimeter Distributed Bragg Reflector," filed on Jul. 31, 2013 (issued as U.S. Pat. No. 9,246,473 on Jan. 26, 2016), which is a continuation-in-part of commonly owned U.S. patent application Ser. No. 13/781,491 entitled "Acoustic Resonator Having Collar and Frame," filed on Feb. 28, 2013 (published as U.S. Patent App. Pub. No. 2014/0118087 on May 1, 2014), which is a continuation-in-part of commonly owned U.S. patent application Ser. No. 13/663,449 entitled "Acoustic Resonator Having Collar Structure," filed on Oct. 29, 2012 (issued as U.S. Pat. No. 9,401,692 on Jul. 26, 2016), which are hereby incorporated by reference in their entireties. U.S. Pat. No. 9,246,473 is also a continuation-in-part under 37 C.F.R. §1.53(b) of commonly owned U.S. patent application Ser. No. 13/208,883 entitled "Stacked Bulk Acoustic Resonator Comprising a Bridge and an Acoustic Reflector along a Perimeter of the Resonator," filed on Aug. 12, 2011 (published as U.S. Patent App. Pub. No. 2012/0218059), which is a continuation-in-part application of commonly owned U.S. patent application Ser. No. 13/074,262 entitled "Stacked Acoustic Resonator Comprising Bridge," filed on Mar. 29, 2011 (published as U.S. Patent App. Pub. No. 2012/0218055), which are hereby incorporated by reference in their entireties.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a first (bottom) electrode and a second (top) electrode over a cavity, while an SMR includes a piezoelectric layer between a first (bottom) electrode and a second (top) electrode mounted on an acoustic reflector. BAW resonators may be used in a wide variety of electronic applications, such as cellular telephones, personal digital assistants (PDAs), electronic gaming devices, laptop computers and other portable communications devices. For example, FBARs and SMRs may be used for high frequency filters and duplexers.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonance frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main active region and peripheral regions, where the main active region is defined, roughly, by an overlap between the two plate electrodes and the piezoelectric material, and the peripheral regions are defined as areas outside the main active region. In an FBAR, two peripheral regions, in particular, are defined as a region located between the edge of the main active region and an edge of the air-cavity in an FBAR, and between the edge of the main active region and a region of an overlap of at least one plate electrode and the piezoelectric material with the substrate. In SMR, one peripheral region, in particular, is defined as an overlap of at least one plate electrode with the piezoelectric material, but not with the other plate electrode. The main active region is subject to electrically excited modes generated by the electric field between the two plate electrodes, and both the main active and the peripheral regions are subject to certain derivative modes generated by scattering of energy in the electrically excited modes. The electrically excited modes comprise, for instance, a piston mode formed by longitudinal acoustic waves with boundaries at the edges of the main active region. The derivative modes comprise, for instance, lateral modes formed by lateral acoustic waves excited at the edges of the main active region and the peripheral regions.

The lateral modes facilitate continuity of appropriate mechanical particle velocities and stresses between the electrically driven main active region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main active region, or an edge of a top or bottom electrode) or by electric field discontinuities (e.g., an edge of a top electrode where the electric field is terminated abruptly). The lateral modes generally have a deleterious impact on the performance of an acoustic resonator. Accordingly, some acoustic resonators include ancillary structural features designed to suppress, inhibit, or mitigate the lateral modes.

The conventional implementation of these ancillary structural features has a number of potential shortcomings. For instance, depending on their specific design, they may be a source of additional scattering of the piston mode which may outweigh their benefits. Additionally, they may require the presence of certain additional materials that can deleteriously redistribute the acoustic energy in the acoustic stack, such as relatively soft planarization layers. Also, some design choices may produce only modest performance improvements while significantly driving up cost. Moreover, the formation of ancillary structural features may degrade structural stability or interfere with the formation of overlying layers.

In addition, conventional FBARs and SMRs rely on strong confinement of electrically excited piston mode. Strong confinement is provided by the edges of the top and bottom electrodes, as well as ancillary structural features, such as air-bridges and conventional outside frames. While the apparent advantage of strong confinement is that it prevents strong electrical excitation of mechanical motion at the edge of the top electrode, it also provides significant acoustic discontinuities, leading to scattering of energy out of the desired piston mode into undesired extensional, shear, flexural and dilatational modes of the whole structure. Accordingly, in view of these and other shortcomings of conventional acoustic resonator structures, there is a general need for improved acoustic resonator designs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
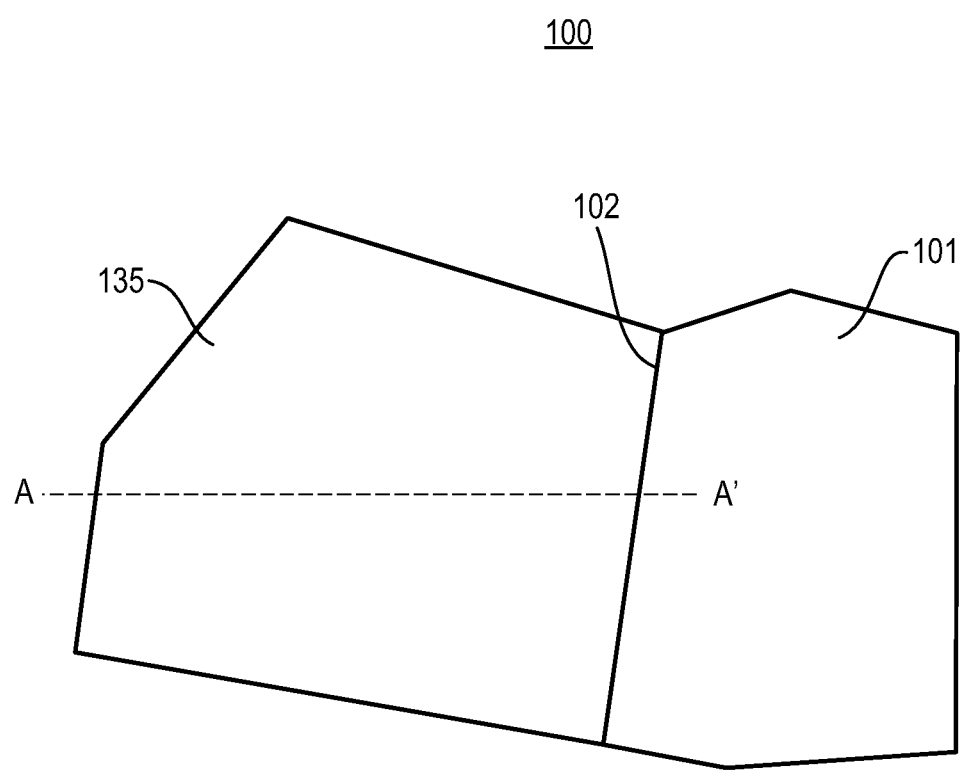
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al. (issued as U.S. Pat. No. 9,385,684 on Jul. 5, 2016); U.S. patent application Ser. No. 13/663,449 to Burak et al. (issued as U.S. Pat. No. 9,401,692 on Jul. 26, 2016); U.S. patent application Ser. No. 13/660,941 to Burak et al. (issued as U.S. Pat. No. 9,425,764 on Aug. 23, 2016); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In certain representative embodiments described below, an acoustic resonator comprises a piezoelectric layer disposed between top and bottom electrodes, and an acoustic reflector, such as a distributed Bragg reflector (DBR), disposed on a substrate. The acoustic reflector includes one or more stacked acoustic reflector layer pairs, each acoustic reflector layer pair including a low acoustic impedance layer formed of low acoustic impedance material stacked on a high acoustic impedance layer formed of high acoustic impedance material. The bottom electrode is disposed on the low acoustic impedance layer of a top acoustic impedance layer pair of the acoustic reflector. The piezoelectric layer is disposed on the bottom electrode, and the top electrode disposed on the piezoelectric layer. Generally, the DBR substantially eliminates so-called "dead-FBAR" region by providing acoustic isolation of a connecting edge of the top electrode from the substrate. This is an advantage of SMRs generally over FBARs. Otherwise, in a "dead-FBAR" region of FBAR device, acoustic vibrations of the acoustic resonator may be attenuated through mechanical scattering of the electrically excited motion at a vertical boundary between the bottom electrode and the underlying substrate and lateral boundary between the air-cavity and the underlying substrate, and through the transducer effect in a region where FBAR acoustic stack overlaps the substrate.

The acoustic resonator may further include a collar disposed outside a main active region and/or a frame disposed within the main active region. The main active region is defined by an overlap between the top electrode, the piezoelectric layer and the bottom electrode. The collar may be formed by a dielectric material outside the boundary of the main active region, for example, to allow a smooth decay of evanescent modes emanating from the boundary and improve confinement of mechanical motion to the main active region. The collar typically has an inner edge substantially aligned with a boundary of the main active region or somewhat overlapping the main active region. Thus, the collar generally couples the evanescent thickness extensional (eTE1) and piston modes of a main active region to the evanescent thickness extensional mode of a collar region. The frame may be formed by a conductive or dielectric material within the boundary of the main active region, for example, to minimize scattering of electrically excited piston mode at top electrode edges and improve confinement of mechanical motion to the main active region. The frame typically has an outer edge substantially aligned with the boundary of the main active region. Thus, the frame generally suppresses excitation of propagating modes.

A collar may be formed of a relatively thick dielectric region of finite width, and may be located in various alternative locations, such as above the top electrode, or between the bottom electrode and the piezoelectric layer. The collar may also be divided into multiple layers and formed in more than one of the above locations. Also, the collar may be formed inside other features of the acoustic resonator, for instance, inside the piezoelectric layer. A region of the acoustic resonator above and below the collar will be referred to as a collar region.

The collar is typically designed so that the cutoff frequency in a collar region is substantially the same as the cutoff frequency in the main active region, and its main non-propagating mode (evanescent mode, for instance) has substantially the same modal distribution as the piston mode in the main active region. This prevents acoustic energy in the piston mode from being converted into unwanted propagating modes in the collar region and propagating and evanescent modes in the main active region. If excited, propagating modes in the collar region in general may lead to energy loss due to acoustic radiation to the region outside of acoustic resonator. Similarly, if excited, propagating and evanescent modes inside the main active region may in general produce lateral voltage gradients, which may lead to lateral current flows and energy loss due to the Joule heating. Thus, the collar may improve confinement of the piston mode within the main active region while suppressing the excitation of unwanted spurious lateral modes inside and outside of the main active region. This, in turn, may reduce overall acoustic scattering loss and enhance the parallel resistance Rp and the quality factor (Q-factor) of the acoustic resonator.

In the absence of the collar, there may be a significant acoustic impedance discontinuity at the edge of the top electrode for an electrically excited piston mode. Because the electric field is also terminated at the edge of top electrode, that edge will cause both mechanical and electrical excitation of evanescent, propagating and complex modes supported by the structures both inside and outside of the main active region. Evanescent and complex modes decay exponentially, so a wide enough collar structure will suppress them. Moreover, propagating modes may be suppressed by forming the collar structure with a proper width. Additionally, a collar structure extending over (or under) the top electrode may act as an integrated frame, thus it may minimize the amplitude of electrically excited piston mode before the top electrode edge and provide additional acoustic impedance discontinuities to suppress propagating modes. Thus, in the presence of a properly designed collar, most of the piston mode energy at the top electrode edge may couple to the evanescent mode in the collar region, which may then decay exponentially and become efficiently suppressed inside a wide enough collar structure. When the collar overlaps with the substrate, the acoustic reflector also prevents the evanescent and complex modes supported by the collar from coupling to the substrate.

A frame may be formed by adding a layer of material, usually an electrically conducting material (although dielectric material is possible as well), to the top and/or bottom electrode. The frame can be either a composite frame or an add-on frame, for example. A composite frame has integrated lateral features, formed of aluminum (Al) and molybdenum (Mo), for example, and is formed by embedding material within the top or bottom electrode, typically with an exposed upper or lower surface being coplanar with an upper or lower surface of the top or bottom electrode. An add-on frame is formed by depositing the material above or below of a layer forming either the bottom or top electrode along a perimeter of the main active region. The use of a composite frame can simplify fabrication of the acoustic resonator with regard to application of layers on planar surfaces. For instance, it can prevent the formation of outcroppings in overlying layers, which can preserve the structural stability of the acoustic resonator. A region of the acoustic resonator above and below the frame will be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the main active region. A frame that lowers the cutoff frequency in the frame region as compared to the main active region will be referred to as a Low Velocity Frame (LVF), while a frame that increases the cutoff frequency in the frame region as compared to the main active region will be referred to as a High Velocity Frame (HVF). The reasoning behind this nomenclature is that for composite frames (for which thicknesses of the frame and main active regions are substantially the same), an increase or decrease of the cutoff frequency is substantially equivalent to an increase or decrease an effective sound velocity of the acoustic stack forming the frame, respectively.

A composite or add-on frame with lower effective sound velocity than the corresponding effective sound velocity of the main active region (i.e., an LVF) generally increases parallel resistance Rp and Q-factor of the acoustic resonator above the cutoff frequency of the main active region. Conversely, a composite or add-on frame with a higher effective sound velocity than the corresponding effective sound velocity of the main active region (i.e., an HVF) generally decreases series resistance Rs and increases Q-factor of the acoustic resonator below the cutoff frequency of the main active region. A typical low velocity frame, for example, effectively provides a region with significantly lower cutoff frequency than the main active region and therefore minimizes the amplitude of the electrically excited piston mode towards the edge of the top electrode in the frame region. Furthermore, it provides two interfaces (impedance missmatch planes), which increase reflection of propagating eigenmodes. These propagating eigenmodes are mechanically excited at active/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of collars and frames, as well as related materials and operating characteristics, are described in the above cited U.S. patent application Ser. Nos. 13/663,449 and 13/660,941 to Burak et al., which are hereby incorporated by reference in their entireties. As explained in those applications, collars and frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or electromechanical coupling coefficient $Kt^2$. Although the following description presents several embodiments in the form of SMR devices, several of the described concepts could be implemented in other forms of acoustic resonators, such as FBARs, for example.

FIG. 1A is a top view of an acoustic resonator 100A according to a representative embodiment, and FIGS. 1B-1F are cross-sectional views of acoustic resonator 100A, taken along a line A-A' according to different embodiments. The cross-sectional views correspond to different variations of acoustic resonator 100A and will be referred to, respectively, as acoustic resonators 100B-100F. Acoustic resonators 100B-100F have many of the same features, so a repetitive description of these features may be omitted in an effort to avoid redundancy.

Referring to FIG. 1A, acoustic resonator 100A comprises a top electrode 135, which may be an apodized shaped electrode, e.g., having five (5) sides in the depicted embodiment, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator 100A.

FIGS. 1B-1F are cross-sectional diagrams illustrating acoustic resonators, according to representative embodiments. In the examples depicted in FIGS. 1B-1F (as well as the examples depicted in FIGS. 2A to 4, discussed below), the acoustic resonator is an SMR device, for convenience of explanation. However, it is understood that other types of acoustic resonators may be included, without departing from the scope of the present teachings. Each of the acoustic resonators shown in FIGS. 1B to 1F includes an acoustic reflector or acoustic mirror, such as a distributed Bragg reflector (DBR), formed beneath the acoustic stack over the substrate. The acoustic reflector includes a plurality of stacked acoustic reflector layer pairs, where each acoustic reflector layer pair includes a low acoustic impedance layer formed of low acoustic impedance material stacked on a high acoustic impedance layer formed of high acoustic impedance material. In various embodiments, the low acoustic impedance layer of one or more of the acoustic impedance layers in the acoustic mirror may be formed of a material enabling it to also serve as a temperature compensating layer, e.g., having a positive temperature coefficient configured to offset negative temperature coefficients of other materials in the acoustic stack. It is understood that the same general configurations may be included in acoustic resonators having frames and/or collars in various locations, without departing from the scope of the present teachings, as discussed below.

Figure 1B:
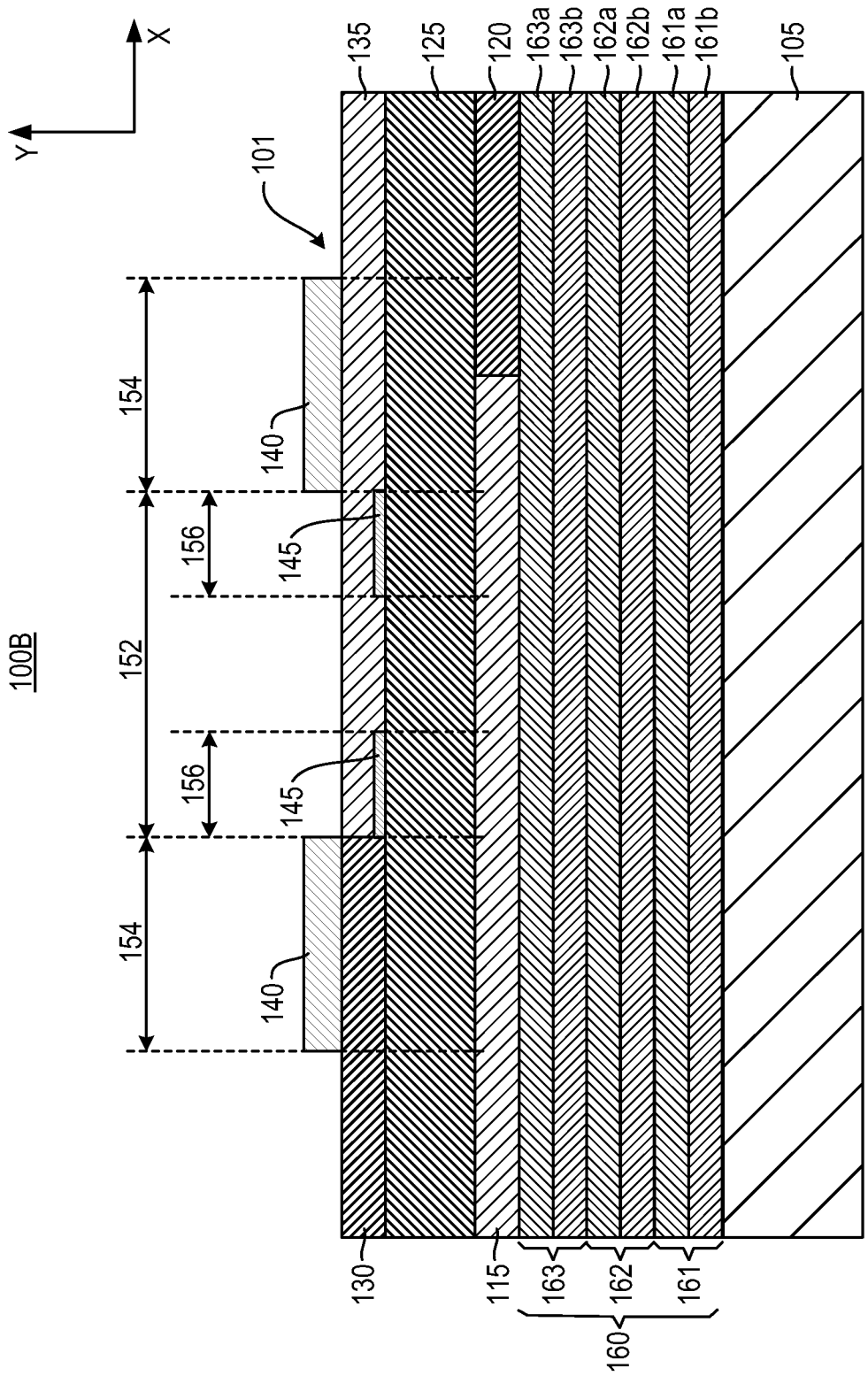
FIG. 1B is a cross-sectional view of an acoustic resonator according to a representative embodiment.

Referring to FIG. 1B, acoustic resonator 100B, which may be an SMR, for example, comprises a substrate 105 and an acoustic reflector, indicated by illustrative distributed Bragg reflector (DBR) 160, formed on a top surface of the substrate 105. The DBR 160 includes multiple pairs of acoustic reflector layer pairs, indicated by representative first acoustic reflector layer pair 161, second acoustic reflector layer pair 162, and third acoustic reflector layer pair 163, sequentially stacked on the substrate 105. The first acoustic reflector layer pair 161 includes first low acoustic impedance layer 161a formed of low acoustic impedance material stacked on first high acoustic impedance layer 161b formed of high acoustic impedance material. The second acoustic reflector layer pair 162 includes second low acoustic impedance layer 162a formed of low acoustic impedance material stacked on second high acoustic impedance layer 162b formed of high acoustic impedance material. The third acoustic reflector layer pair 163 includes third low acoustic impedance layer 163a formed of low acoustic impedance material stacked on third high acoustic impedance layer 163b formed of high acoustic impedance material.

A bottom (first) electrode 115 is disposed on the DBR 160, and a first planarization layer 120 is disposed on the DBR 160 adjacent to the bottom electrode 115. A piezoelectric layer 125 is disposed on the bottom electrode 115 and the first planarization layer 120. A top (second) electrode 135 is disposed on the piezoelectric layer 125. Collectively, the bottom electrode 115, the piezoelectric layer 125, and the top electrode 135 constitute an acoustic stack of the acoustic resonator 100B. A second planarization layer 130 is disposed on the piezoelectric layer 125 adjacent to the top electrode 135 to accommodate collar 140, although the second planarization layer 130 is not needed if there is no collar or if the collar is located elsewhere in the acoustic stack, as discussed below.

The first, second and third low acoustic impedance layers 161a, 162a and 163a, and the first, second and third high acoustic impedance layers 161b, 162b and 163b may be formed with respective thicknesses corresponding to a quarter wavelength of a natural resonance frequency of acoustic resonator 100B, for example. Generally, the amount of acoustic isolation provided by DBR 160 depends on the contrast between the acoustic impedances of adjacent acoustic impedance layers and a total number of layers forming DBR 160, with a greater amount of contrast and larger number of layers creating better acoustic isolation. In some embodiments, the DBR 160 is formed of pairs of dielectric materials having contrasting acoustic impedances. In alternative embodiments one or both of the low and high acoustic impedance layers may be formed of metal material having contrasting acoustic impedances.

In the depicted representative embodiment, the DBR 160 comprises three pairs of acoustic impedance layers, first acoustic reflector layer pair 161, second acoustic reflector layer pair 162 and third acoustic reflector layer pair 163. The first low acoustic impedance layer 161a of the first acoustic reflector layer pair 161 is formed of a material having relatively low acoustic impedance (which may be a relatively soft material). For example, the first acoustic impedance layer 161a may be formed of boron silicate glass (BSG), tetra-ethyl-ortho-silicate (TEOS), silicon oxide ($SiO_x$) or silicon nitride ($SiN_x$) (where x is an integer), carbon-doped silicon oxide (CDO), chemical vapor deposition silicon carbide (CVD SiC), plasma enhanced CVD SiC (PECVD SiC), niobium molybdenum (NbMo), titanium (Ti) or aluminum. The first high acoustic impedance layer 161b paired with the first low acoustic impedance layer 161a in the first acoustic reflector layer pair 161 is formed of a material having relatively high acoustic impedance (which may be a relatively hard material). For example, the first high acoustic impedance layer 161b may be formed of tungsten (W), molybdenum (Mo), iridium (Ir), hafnium oxide ($HfO_2$), aluminum oxide ($Al_2O_3$), diamond or diamond-like carbon (DLC). Likewise, the second and third low acoustic impedance layers 162a and 163a of the second and third acoustic reflector layer pairs 162 and 163, respectively, are formed of materials having relatively low acoustic impedances, and the second and third high acoustic impedance layers 162b and 163b, respectively paired with the second and third low acoustic impedance layers 162a and 163a, in the second and third acoustic reflector layer pairs 162 and 163 are formed of materials having relatively high acoustic impedances.

Of course, in various embodiments, the DBR 160 may include other numbers of acoustic reflector layer pairs, e.g., to achieve specific design objectives, without departing from the scope of the present teachings. Various illustrative fabrication techniques of acoustic mirrors are described by in U.S. Pat. No. 7,358,831 (Apr. 15, 2008), to Larson III, et al., which is hereby incorporated by reference in its entirety. Also, in various embodiments, the first, second and third low acoustic impedance layers 161a, 162a and 163a are formed of the same material as one another, and the first, second and third high acoustic impedance layers 161b, 162b and 163b are formed of the same material as one another. However, in alternative embodiments, the first, second and/or third low acoustic impedance layers 161a, 162a and 163a may be formed of different materials, and/or the first, second and/or third high acoustic impedance layers 161b, 162b and 163b may be formed of different materials, without departing from the scope of the present teachings.

In another example, the first, second and third low acoustic impedance layers 161a, 162a and 163a (e.g., odd acoustic impedance layers) may be formed of carbon-doped silicon oxide (CDO), while the corresponding paired first, second and third high acoustic impedance layers 161b, 162b and 163b (e.g., even acoustic impedance layers) may be formed of silicon nitride ($SiN_x$), where x is an integer. A benefit of this pairing of materials is that the pair of layers may be grown in a single machine by depositing CDO onto a silicon wafer, for example, within a first chamber, moving the wafer to a second chamber, depositing silicon nitride on the wafer in the second chamber, moving the wafer back into the first chamber, and so on.

Further, as mentioned above, at least one of the acoustic impedance layers of the DBR 160 having relatively low acoustic impedance (e.g., first, second and/or third low acoustic impedance layers 161a, 162a and 163a) may be formed of a material that also provides temperature compensation for the acoustic resonator 100B (e.g., BSG, TEOS, $SiO_2$, and/or NbMo), for example, which have positive temperature coefficients. The positive temperature coefficient of the temperature compensating acoustic impedance layer offsets negative temperature coefficients of other materials in the acoustic stack, including the piezoelectric layer 125, the bottom electrode 115, and the top electrode 135, for example. The relative thicknesses of the temperature compensating acoustic impedance layer(s) and the non-temperature compensating acoustic impedance layer(s) should be optimized in order to maximize the coupling coefficient for an allowable linear temperature coefficient. Providing a temperature compensating acoustic impedance layer is described, for example, by U.S. patent application Ser. No. 14/092,077 (filed Nov. 27, 2013), to Burak et al. (published as U.S. Patent App. Pub. No. 2014/0159548 on Jun. 12, 2014), which is hereby incorporated by reference in its entirety. Also, various illustrative fabrication techniques of temperature compensating layers are described by U.S. patent application Ser. No. 13/766,993 (filed Feb. 14, 2013), to Burak et al. (published as U.S. Patent App. Pub. No. -2014/0118092 on May 1, 2014), which is hereby incorporated by reference in its entirety.

As mentioned above, the DBR 160 substantially eliminates "dead-FBAR" by providing acoustic isolation of a connecting edge of the top electrode 135 from the substrate 105. The DBR 160 also prevents evanescent and complex modes of the region outside of the top electrode 135 (between the top electrode edge and the bottom electrode 115 edge) from coupling to the substrate 105, as evanescent and complex modes decay exponentially from the excitation edge located at the edge of the top electrode 135.

Notably, FIG. 1B depicts a single acoustic resonator 100B. If the acoustic resonator 100B were to be included in a device with additional acoustic resonators, for example, in a filter including 5-10 acoustic resonators, the first, second and third acoustic reflector layer pairs 161, 162 and 163 of the DBR 160 would need to be electrically isolated from acoustic reflector layer pairs of DBRs of the other acoustic resonators, as would be apparent to one of ordinary skill in the art. For example, a trench or other isolating means may be etched off around the DBR 160 down to the substrate 105. This particularly may be the case when the DBR 160 includes acoustic impedance layers formed of metal, which are patterned (etched off outside of the acoustic resonator 100B) in order to provide electrical isolation from other acoustic resonators.

The bottom electrode 115 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the bottom electrode 115 may be formed of two or more layers of electrically conductive materials, which may by the same as or different from one another. Likewise, the top electrode 135 may be formed of electrically conductive materials, such as various metals compatible with semiconductor processes, including tungsten (W), molybdenum (Mo), iridium (Ir), aluminum (Al), platinum (Pt), ruthenium (Ru), niobium (Nb), or hafnium (Hf), for example. In various configurations, the top electrode 135 may be formed of two or more layers of electrically conductive materials, which may by the same as or different from one another. Also, the configuration and/or the material(s) forming the top electrode 135 may be the same as or different from the configuration and/or the material(s) forming the bottom electrode 115.

The substrate 105 may be formed of a material compatible with semiconductor processes, such as silicon (Si), gallium arsenide (GaAs), indium phosphide (InP), glass, sapphire, alumina, or the like, for example. The piezoelectric layer 125 may be formed of any piezoelectric material compatible with semiconductor processes, such as aluminum nitride (AlN), zinc oxide (ZnO), or zirconate titanate (PZT), for example.

The first planarization layer 120 may be formed of borosilicate glass (BSG), for example. The first planarization layer 120 is not strictly required for the functioning of acoustic resonator 100B, but its presence can confer various benefits. For instance, the presence of the first planarization layer 120 tends to improve the structural stability of acoustic resonator 100B, may improve the quality of growth of subsequent layers. Further examples of potential benefits of planarization are presented in U.S. Patent App. Pub. No. 2013/0160534 to Burak et al., which is hereby incorporated by reference in its entirety.

Referring again to FIG. 1B, the acoustic resonator 100B further comprises a collar 140 disposed on the second planarization layer 130 and the top electrode 135, and a frame 145 disposed in a bottom portion of the top electrode 135. Although not shown, a passivation layer may be present on top of the top electrode 135 with thickness sufficient to insulate all layers of the acoustic stack from the environment, including protection from moisture, corrosives, contaminants, debris and the like.

The collar 140 may be formed of a dielectric material of predetermined thickness and width that substantially surrounds the main active region. The dielectric material may be borosilicate glass (BSG), silicon dioxide (SiO$_2$), carbon-doped silicon oxide (CDO), silicon nitride (SiN), silicon carbide (SiC), aluminum nitride (AlN), zinc oxide (ZnO), aluminum oxide (Al$_2$O$_3$), diamond, diamond like carbon (DLC), or lead zirconium titanate (PZT), for example. Alternatively, the collar 140 may be formed of a metal material, such as tungsten (W), molybdenum (Mo) or iridium (Ir). Advantages of using metal may include the collar 140 having a relatively high acoustic impedance and a relatively small thickness (e.g., few hundred Angstroms). Also, the collar 140 may be biased to provide additional suppression of spurious modes in the collar region. In addition, numerical simulations suggest that the metal collar 140 eases alignment requirements at the edge of the top electrode 135. The frame 145 may be formed of one or more conductive or dielectric materials, such as copper (Cu), molybdenum (Mo), aluminum (Al), tungsten (W), iridium (Ir), borosilicate glass (BSG), carbon-doped silicon oxide (CDO), silicon carbide (SiC), silicon nitride (SiN), silicon dioxide (SiO$_2$), aluminum oxide (Al$_2$O$_3$), aluminum nitride (AlN), zinc oxide (ZnO), lead zirconium titanate (PZT), diamond or diamond-like carbon (DLC), for example.

The second planarization layer 130 may be formed of borosilicate glass (BSG), for example. Notably, the use of a high acoustic impedance material in the second planarization layer 130, tends to produce a vertical modal energy distribution across the acoustic stack in the region of the collar 140 that matches more closely a vertical modal energy distribution across the acoustic stack in the active region. This allows a closer match between a vertical distribution of the modal energy distribution of electrically excited piston mode in the active region and a vertical modal energy distribution of the evanescent thickness extensional (eTE1) mode in the region of the collar 140 at frequencies around the series resonance frequency Fs of the acoustic resonator 100B. The eTE1 mode may then decay exponentially in the direction away from the collar/active region interface without coupling to other propagating modes supported by the acoustic resonator 100B structure. This in turn may result in overall reduced scattering loss in the collar region and may produce significant improvements in parallel resistance Rp and quality factor Q. Moreover, use of higher acoustic impedance materials in the collar 140 and the passivation layer may also contribute to improved performance for similar reasons.

Of course, other materials may be incorporated into the above and other features of acoustic resonator 100B without departing from the scope of the present teachings.

A double-headed arrow 152 indicates an active region of the acoustic resonator 100B, and dotted vertical lines indicate a boundary of the main active region 152. This boundary coincides with the edge of the top electrode 135, except on connecting side 101, where the top electrode 135 extends beyond the boundary of the main active region 152. Double-headed arrows 154 and 156 indicate respective collar and frame regions of acoustic resonator 100B, and corresponding dotted vertical lines indicate boundaries of these regions. When viewed from a top angle, such as that of FIG. 1A, the above regions and their boundaries may have an apodized shape. As illustrated in FIG. 1B, the collar 140 has an inner edge that is substantially aligned with the boundary of the main active region 152, and the frame 145 has an outer edge that is substantially aligned with the same boundary.

In the example of FIG. 1B, the main active region 152 does not include the full extent of overlap between bottom and top electrodes 115 and 135 and piezoelectric layer 125, because the illustrated right side of top electrode 135 is a connecting edge and it is not intended to modify the characteristic electrical impedance at an operating frequency range of the acoustic resonator 100B in any significant way. However, termination of bottom electrode 115 at the edge of the main active region 152 may cause significant acoustic energy loss due to abrupt change of the acoustic impedance profile in lateral direction. This energy loss may be prevented by extending bottom electrode 115 further under the top electrode 135 connecting edge 101 and mass-loading that region with collar 140.

During typical operation of acoustic resonator 100B, as a part of a ladder filter, for instance, an input electrical signal may be applied to an input terminal of the bottom electrode 115 and the top electrode 135 may be connected to the output terminal. The input electrical signal may include a time-varying voltage that causes vibration in the main active region. This vibration in turn produces an output electrical signal at an output terminal of the top electrode 135. The input and output terminals may be connected to bottom and top electrodes 115 and 135 via connection edges that extend away from the main active region 152 as shown in FIG. 1B. For example, from a top view, these connection edges may be seen to extend outside of an apodized pentagon shape, such as that illustrated in FIG. 1A. The input and output terminals of acoustic resonator 100B may be connected to appropriate terminals of other acoustic resonators forming the ladder filter, for instance.

The electrically excited piston mode is terminated at the edge of top electrode 135. This structural discontinuity at the edge of top electrode 135 presents a significant discontinuity in cutoff frequencies between the main active region 152 and peripheral regions, and it causes excitation of lateral modes in both the main active region 152 and the peripheral regions to facilitate continuity of appropriate particle velocity and stress components at the interface between these regions. This can lead to undesirable scattering of acoustic energy from the piston mode and the resulting degradation of electrical response of acoustic resonator 100B. Collar 140, however, provides mass loading which lowers the cutoff frequency outside the main active region 152, producing a more laterally uniform cutoff frequency profile across acoustic resonator 100B. Similarly, the frame 145 suppresses electrically excited piston mode in the frame region, and it reflects and otherwise resonantly (exponentially) suppresses propagating (evanescent and complex) eigenmodes in lateral directions, with both effects simultaneously improving operation of acoustic resonator 100B. In other words, performance improvement of acoustic resonator 100B is facilitated by at least one of a cutoff frequency mismatch and an acoustic impedance mismatch between the frame region and other portions of the main active region 152 which is produced by frame 145.

Meanwhile, as discussed above, the DBR 160 generally mitigates acoustic losses in the vertical direction (y-dimension in the coordinate system depicted in FIG. 1B) of the acoustic resonator 100B. The principle of operation of the DBR 160 relies on the fact that, due to destructive interference of an incident acoustic wave, its total amplitude decays exponentially in the direction of propagation through the acoustic stack (in this case away from the interface between bottom electrode 115 and third low acoustic impedance layer 163a). In general, such beneficial exponential decay of wave amplitude is only possible if the thicknesses of the third low and high acoustic impedance layers 163a and 163b, as well as any additional acoustic impedance layers (e.g., second low and high acoustic impedance layers 162a and 162b, and first low and high acoustic impedance layers 161a and 161b) comprising the DBR 160 are equal to or close to equal to an odd multiple of the quarter wavelength of an incident acoustic wave. At the bottom of the DBR stack (in this case at the interface between the first high acoustic impedance layer 161b and the substrate 105), the wave amplitude is small, thus yielding negligible radiation of acoustic energy into the substrate 105. In other words, the acoustic energy incident upon the DBR 160 is being reflected back with only small transmission of acoustic energy into the substrate 105. Notably, the beneficial reflectivity properties of the DBR 160 are in general possible for a limited range of frequencies, a specific polarization and a limited range of propagation angles of an incident wave. In practical cases when the range of frequencies is given by a bandwidth of a filter and multiple eigenmodes are being excited in the active region, the optimal thicknesses of the various acoustic impedance layers are found numerically and experimentally.

Also as mentioned above, the use of three stacked acoustic reflector layer pairs (e.g., first acoustic reflector layer pair 161, second acoustic reflector layer pair 162, and third acoustic reflector layer pair 163) is merely illustrative, and the DBR 160 may comprise fewer or more than three acoustic reflector layer pairs, without departing from the scope of the present teachings. The number of acoustic reflector layer pairs provided for the DBR 160 is determined by a tradeoff between expected reflection performance (the more pairs and/or layers the better) and cost and processing issues (the fewer pairs and/or layers the cheaper and more straightforward mirror growth and post-processing). The amount of acoustic isolation of the excited eigenmodes provided by the DBR 160 also depends on the contrast between the acoustic impedances of the adjacent low and high acoustic impedance layers of each acoustic reflector layer pair, with a greater amount of contrast creating better acoustic reflection of the eigenmodes with dominant vertical polarization component, as discussed above.

In an embodiment, the acoustic impedance layers of the DBR 160 are provided over the substrate 105 using materials deposited by known methods. For example, the first high acoustic impedance layer 161b may be formed over the substrate 105, and the first low acoustic impedance layer 161a may be formed over the first high acoustic impedance layer 161b. In another embodiment, the first low acoustic impedance layer 161a may be formed over the substrate 105 directly, providing a single layer as opposed to the layer pair. The additional second and third acoustic reflector layer pairs 162 and 163 may be sequentially formed over the first low acoustic impedance layer 161a. The layers of the DBR 160 can be fabricated using various known methods, an example of which is described in U.S. Pat. No. 7,358,831 (Apr. 15, 2008) to Larson, III, et al., the disclosure of which is hereby incorporated by reference in its entirety.

In general, the main active region 152 of the acoustic resonator 100B is defined by the presence of air (essentially zero acoustic impedance material) at the top boundary and an acoustic mirror at the bottom boundary. Therefore vertical stress components are zero at the top boundary and, through proper selection of materials in the DBR 160, vertical stress components are lowered at the bottom boundary (between the bottom electrode 115 and the third low acoustic impedance layer 163a). Such a lowered stress condition is however possible when thickness of the third low acoustic impedance layer 163a is reasonably close to an odd multiple of the quarter wavelength of the modes (e.g., in this case electrically driven piston mode and eTE1 eigenmode) for which the DBR 160 is being designed. Adding more, similarly constructed, acoustic impedance layers to the DBR 160 (e.g., first and second low acoustic impedance layers 161a and 162a) further lowers the vertical stress at the interface between the bottom electrode 115 and the third low acoustic impedance layer 163a, thus allowing for closer approximation of an ideal zero-stress condition.

However, as mentioned above, while lower vertical stress for electrically driven piston mode and eTE1 eigenmode is realized by proper selection of the thicknesses of all acoustic impedance layers comprising DBR 160, for other modes which are excited either electrically or mechanically (by modal coupling at the lateral edges of the active region) that may not necessarily be the case and leakage of these modes through the DBR 160 may be actually enhanced (leading to lesser than expected energy confinement). For instance, presence of relatively thick third low acoustic impedance layer 163a generally lowers the cutoff frequency of the second order thickness shear mode TS2, which in turn increases the shear component in the eTE1 mode at the parallel resonance frequency Fp resulting in weaker coupling of eTE1 modes supported by the collar 140. That weaker coupling causes stronger excitation of propagating modes and increased radiative loss, as described above in relation to collar operating principles. In other words, proximity of TS2 resonance to TE1 resonance in the DBR 160 region may increase lateral leakage of acoustic energy. To address that problem, a thinner than quarter wavelength third low acoustic impedance layer 163a may be used, which in turn may adversely reduce overall reflectivity of DBR 160 in vertical direction. The proper balance between these two leakage mechanisms is usually determined by numerical simulations and experiments.

Each of the first, second and third low acoustic impedance layers 161a, 162a and 163a, and the first, second and third high acoustic impedance layers 161b, 162b and 163b has a corresponding thicknesses in the range of approximately 1000 Å to approximately 50000 Å, respectively, depending on the material used and the frequency operating range of the filter. As mentioned above, the total thickness of all the low and high acoustic impedance layers comprising the DBR 160 is substantially equal to one quarter-wavelength of the fundamental mode in the selected material and excited at the selected operational frequency (e.g., series resonance frequency). For example, if each of the first, second, and third low acoustic impedance layers 161a, 162a and 163a, respectively, comprises TEOS for operation at about 800 MHz (series resonance frequency), then each of the first, second and third low acoustic impedance layer 161a, 162a and 163a has a thickness of approximately 2.6 μm. In this example, each of the first, second and third high acoustic impedance layers 161b, 162b and 163b may comprise SiN, having a thickness of approximately 3.2 μm for operation at about 800 MHz. Notably, the thickness of all acoustic impedance layers of the DBR 160 can be selected to be odd-multiple (e.g., 5) quarter-wavelengths of the fundamental acoustic resonator eigenmode in the selected material (e.g., if one quarter-wavelength layer is too thin for practical processing).

Figure 1C:
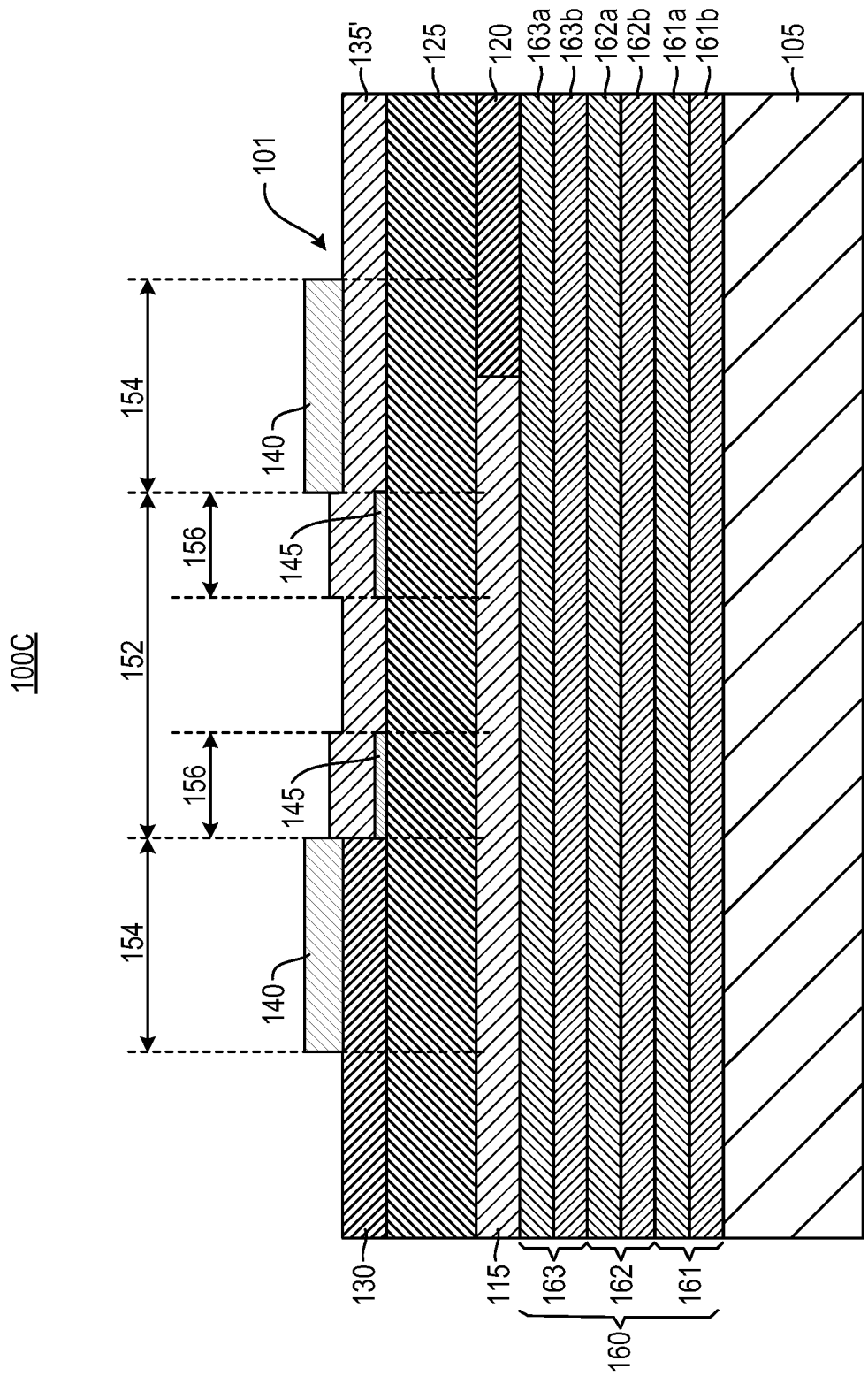
FIG. 1C is a cross-sectional view of an acoustic resonator according to another representative embodiment.

Referring to FIG. 1C, the acoustic resonator 100C is similar to the acoustic resonator 100B, except for formation of the frame 145. That is, unlike acoustic resonator 100B, in which the frame 145 is a composite frame (integrally formed within a corresponding electrode to provide planar top surfaces), the frame 145 in top electrode 135' of the acoustic resonator 100C is an add-on frame. An add-on frame results in a substantially non-planar top surface profile of the top electrode 135'.

Generally, because only a passivation layer usually would be formed on the top electrode 135', such non-planar profiles of the top electrode 135' would not have any significant impact on structural robustness of the acoustic resonator 100C. On the other hand, frames 150 and 150' in acoustic resonators 100D to 100F, discussed below, would be composite frames if included in acoustic resonator 100C, resulting in substantially planar top surface profiles of the electrodes 115. Such substantially planar top surfaces would be preferable in the bottom electrode 115 of acoustic resonator 100C in order to form a high quality, void-free piezoelectric layer 125 and top electrode 135'. Some additional general tradeoffs of different frame configurations are described, for instance, in the above cited U.S. patent application Ser. No. 13/663,449 (issued as U.S. Pat. No. 9,401,692 on Jul. 26, 2016). Of course, the structure of the add-on frame 145 may be applied to frames included in the acoustic resonators 100D through 300D, without departing from the scope of the present teachings. In addition, other frame configurations (add-on and composite) may be incorporated, such as additional frame configurations disclosed by U.S. patent application Ser. No. 13/781,491, filed Feb. 28, 2013 (published as U.S. Patent App. Pub. No. 2014/0118087 on May 1, 2014), for example, without departing from the scope of the present teachings.

Otherwise, the acoustic resonator 100C includes substrate 105, DBR 160 disposed on the substrate 105, bottom electrode 115 disposed on the DBR 160, and first planarization layer 120 is disposed on the DBR 160 adjacent to the bottom electrode 115. Piezoelectric layer 125 is disposed on the bottom electrode 115 and the first planarization layer 120, and the top electrode 135 and second planarization layer 130 are disposed on the piezoelectric layer 125. The DBR 160 includes multiple pairs of stacked acoustic reflector layer pairs, indicated by representative first acoustic reflector layer pair 161, second acoustic reflector layer pair 162, and third acoustic reflector layer pair 163. The first acoustic reflector layer pair 161 includes first high acoustic impedance layer 161b on the substrate 105, and first low acoustic impedance layer 161a stacked on the first high acoustic impedance layer 161b. The second acoustic reflector layer pair 162 includes second high acoustic impedance layer 162b stacked the first low acoustic impedance layer 161a, and second low acoustic impedance layer 162a stacked on the second high acoustic impedance layer 162b. The third acoustic reflector layer pair 163 includes third high acoustic impedance layer 163b stacked the second low acoustic impedance layer 162a, and third low acoustic impedance layer 163a stacked on the third high acoustic impedance layer 163b. As discussed above, the first, second and third low acoustic impedance layers 161a, 162a and 163a are formed of materials having relatively low acoustic impedances, the first, second and third high acoustic impedance layers 161b, 162b and 163b are formed of materials having relatively high acoustic impedances. More or fewer acoustic reflector layer pairs may be included.

Figure 1D:
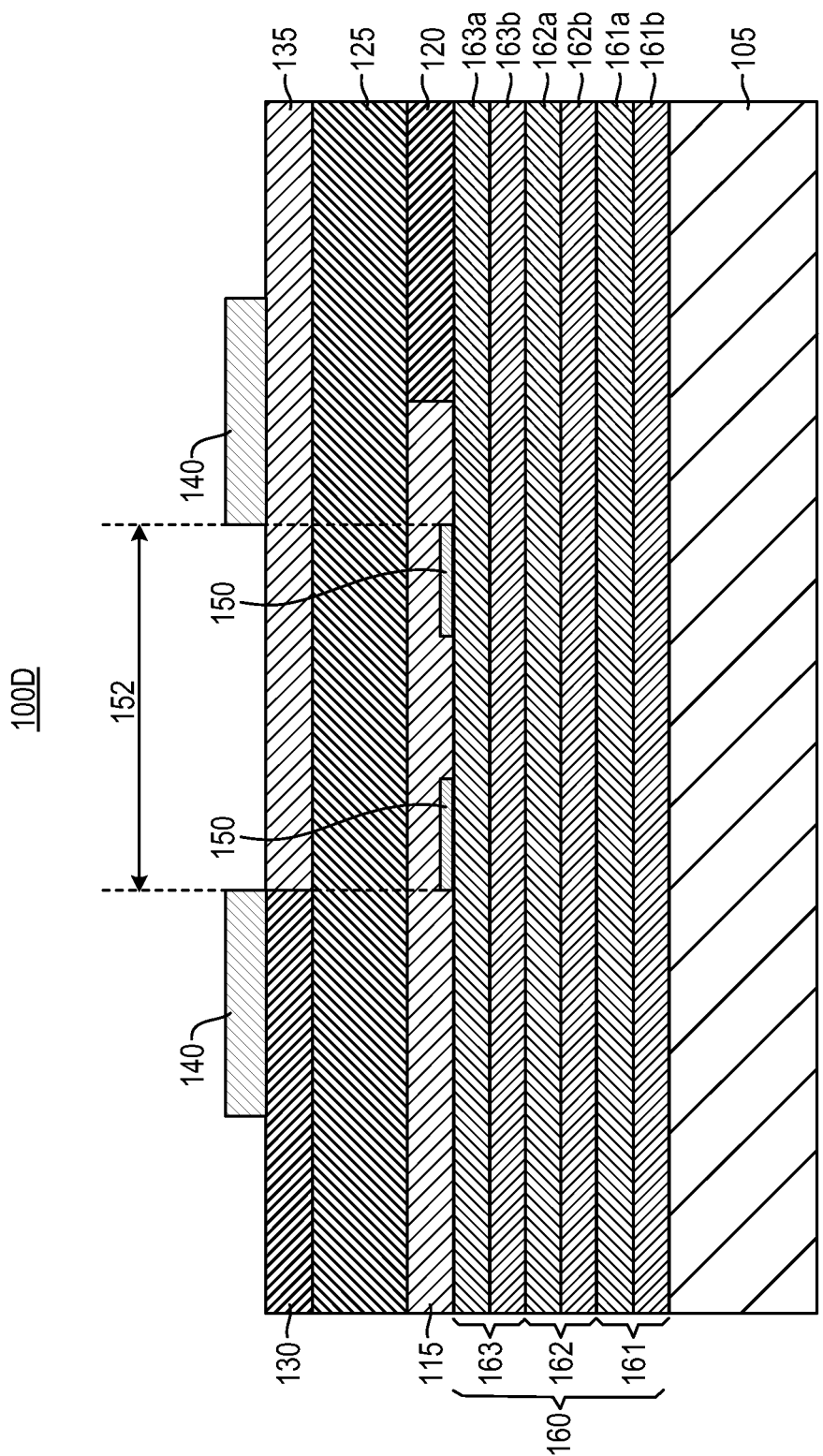
FIG. 1D is a cross-sectional view of an acoustic resonator according to another representative embodiment.
Figure 1E:
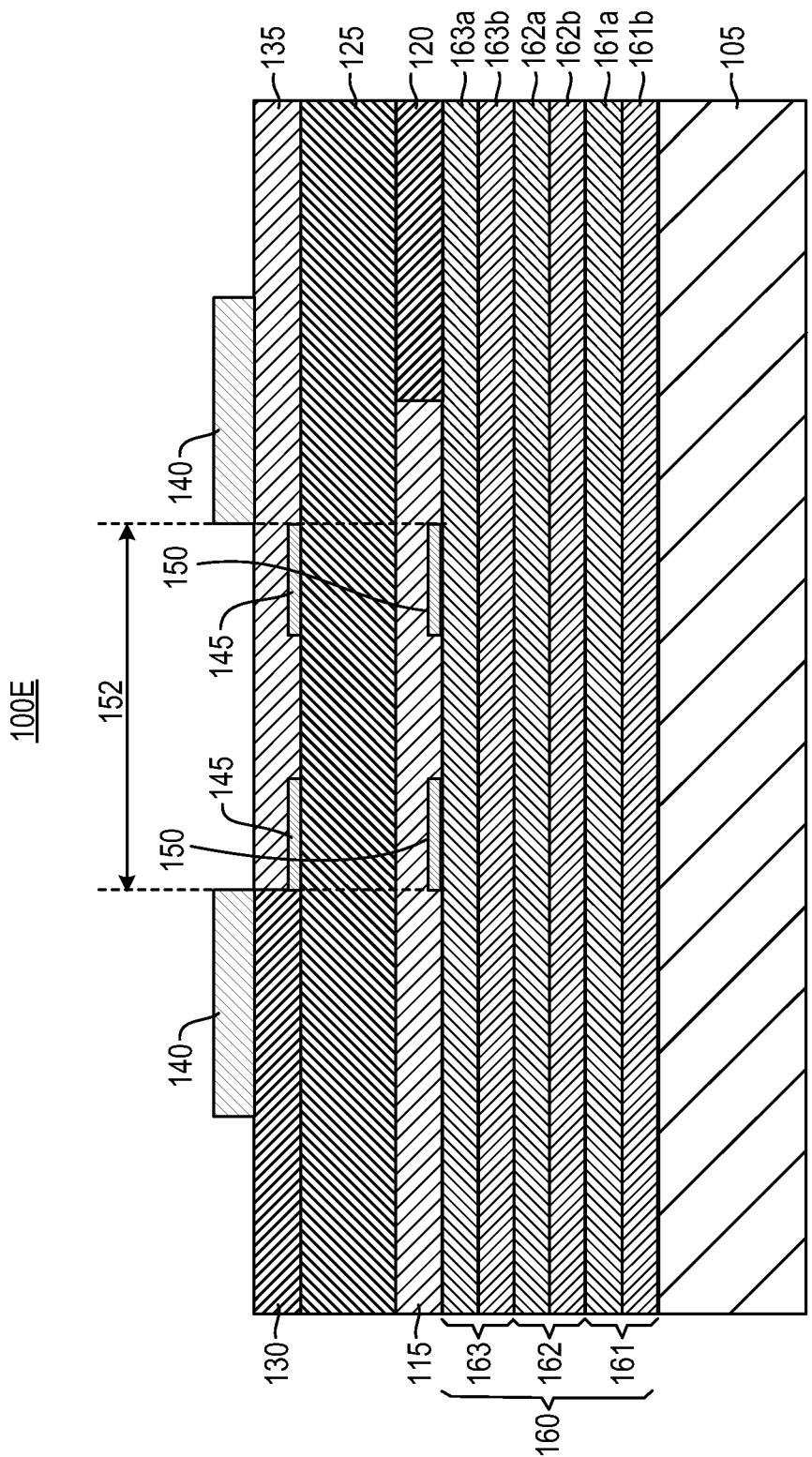
FIG. 1E is a cross-sectional view of an acoustic resonator according to another representative embodiment.
Figure 1F:
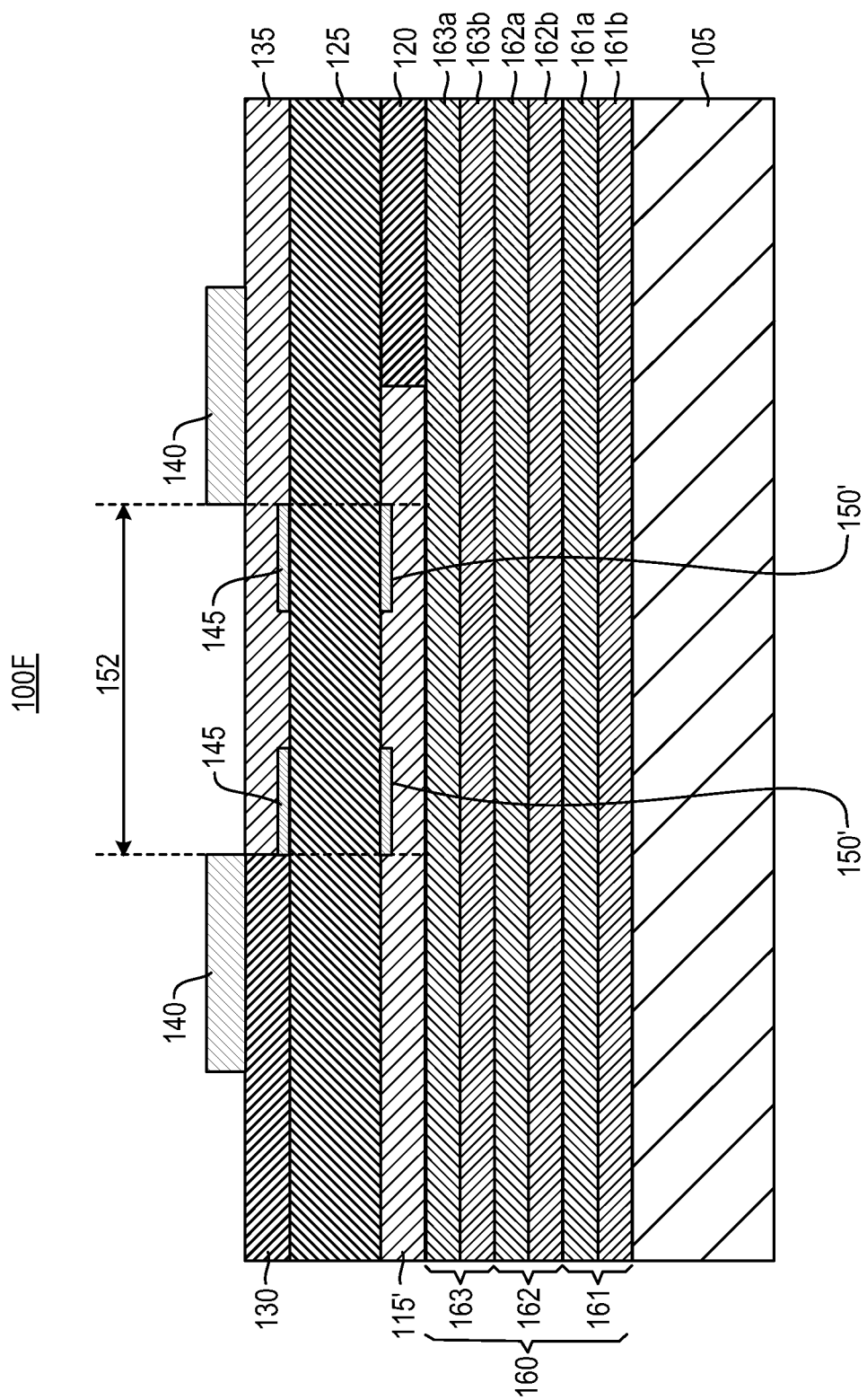
FIG. 1F is a cross-sectional view of an acoustic resonator according to another representative embodiment.

FIGS. 1D, 1E and 1F depict additional variations of the acoustic resonator 100B. In particular, in FIG. 1D, acoustic resonator 100D is substantially the same as acoustic resonator 100B, except that frame 145 is omitted and frame 150 is located at a bottom portion of bottom electrode 115. In FIG. 1E, acoustic resonator 100E is substantially the same as acoustic resonator 100B, except that frame 150 is provided at a bottom portion of bottom electrode 115, in addition to frame 145 in the top electrode 135. In FIG. 1F, acoustic resonator 100F is substantially the same as acoustic resonator 100B, except that frame 150' is provided at a top portion of bottom electrode 115, in addition to frame 145 in the top electrode 135. Of course, each of the acoustic resonators 100C through 100F include the DBR 160 with first, second and third acoustic reflector layer pairs 161, 162 and 163, as discussed above.

The frames 150 and 150' in acoustic resonators 100D through 100F provide benefits similar to frame 145 of acoustic resonator 100B, although their performance and manufacturing processes will vary somewhat due to the different locations of the frames. Some general tradeoffs of different frame configurations are described, for instance, in the above cited U.S. patent application Ser. No. 13/660,941.

In various embodiments, the piezoelectric layer 125 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 125. The doping may off-set at least a portion of degradation of the electromechanical coupling coefficient $Kt^2$ of the acoustic resonator, which may be caused by acoustic energy penetration into the DBR 160. Examples of doping piezoelectric layers with at least one rare earth elements for improving electromechanical coupling coefficient $Kt^2$ are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Of course, doping piezoelectric layers with one or more rare earth elements may be applied to any of various embodiments, including the embodiments described with reference to FIGS. 1B through 3D.

FIGS. 2A-2D are cross-sectional diagrams illustrating acoustic resonators, according to representative embodiments, including various arrangements of collars and frames.

FIGS. 2A through 2D are cross-sectional views of acoustic resonators 200A through 200D, respectively, according to other representative embodiments. The acoustic resonators 200A through 200D are similar to acoustic resonators 100B through 100F, respectively, except that collar 140 is omitted and a collar 240 is instead formed between bottom electrode 115 and piezoelectric layer 125. The collar 240 provides benefits similar to the collar 140 of acoustic resonators 100B through 100F, although its performance and manufacture vary somewhat due to the different location of the collar 240.

Referring to FIGS. 2A through 2D, each of acoustic resonators 200A through 200D, which may be an SMR, for example, includes substrate 105, DBR 160 disposed on the substrate 105, bottom electrode 115, 215 disposed on the DBR 160, and first planarization layer 120 disposed on the DBR 160 adjacent to the bottom electrode 115, 215. Piezoelectric layer 125 is disposed on the bottom electrode 115, 215 and the first planarization layer 120, and the top electrode 135, 235 is disposed on the piezoelectric layer 125.

The DBR 160 includes multiple pairs of acoustic reflector layer pairs, indicated by representative first acoustic reflector layer pair 161, second acoustic reflector layer pair 162, and third acoustic reflector layer pair 163, sequentially stacked on the substrate 105. The first acoustic reflector layer pair 161 includes first low acoustic impedance layer 161a formed of low acoustic impedance material stacked on first high acoustic impedance layer 161b formed of high acoustic impedance material. The second acoustic reflector layer pair 162 includes second low acoustic impedance layer 162a formed of low acoustic impedance material stacked on second high acoustic impedance layer 162b formed of high acoustic impedance material. The third acoustic reflector layer pair 163 includes third low acoustic impedance layer 163a formed of low acoustic impedance material stacked on third high acoustic impedance layer 163b formed of high acoustic impedance material. In an embodiment, one or more of the first, second and third low acoustic impedance layers 161a, 162a and 163a may be configured to act as a temperature compensating layer, in that the low acoustic impedance layers may be formed of a temperature compensating material that has a positive temperature coefficient for offsetting the negative temperature coefficients of at least the bottom electrode 115, 215, the piezoelectric layer 125 and/or the top electrode 135, 235.

Figure 2A:
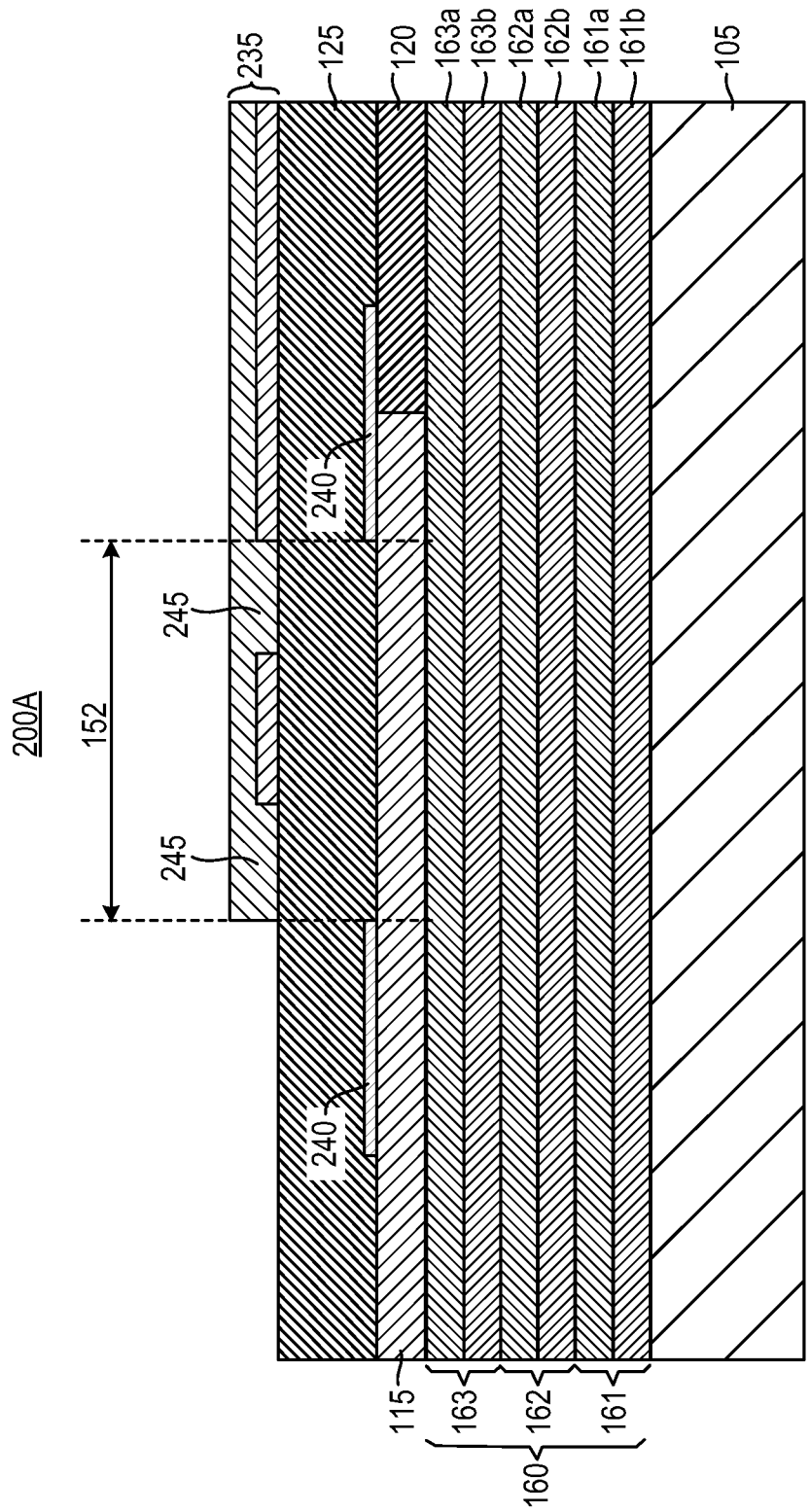
FIG. 2A is a cross-sectional view of an acoustic resonator according to another representative embodiment.
Figure 2B:
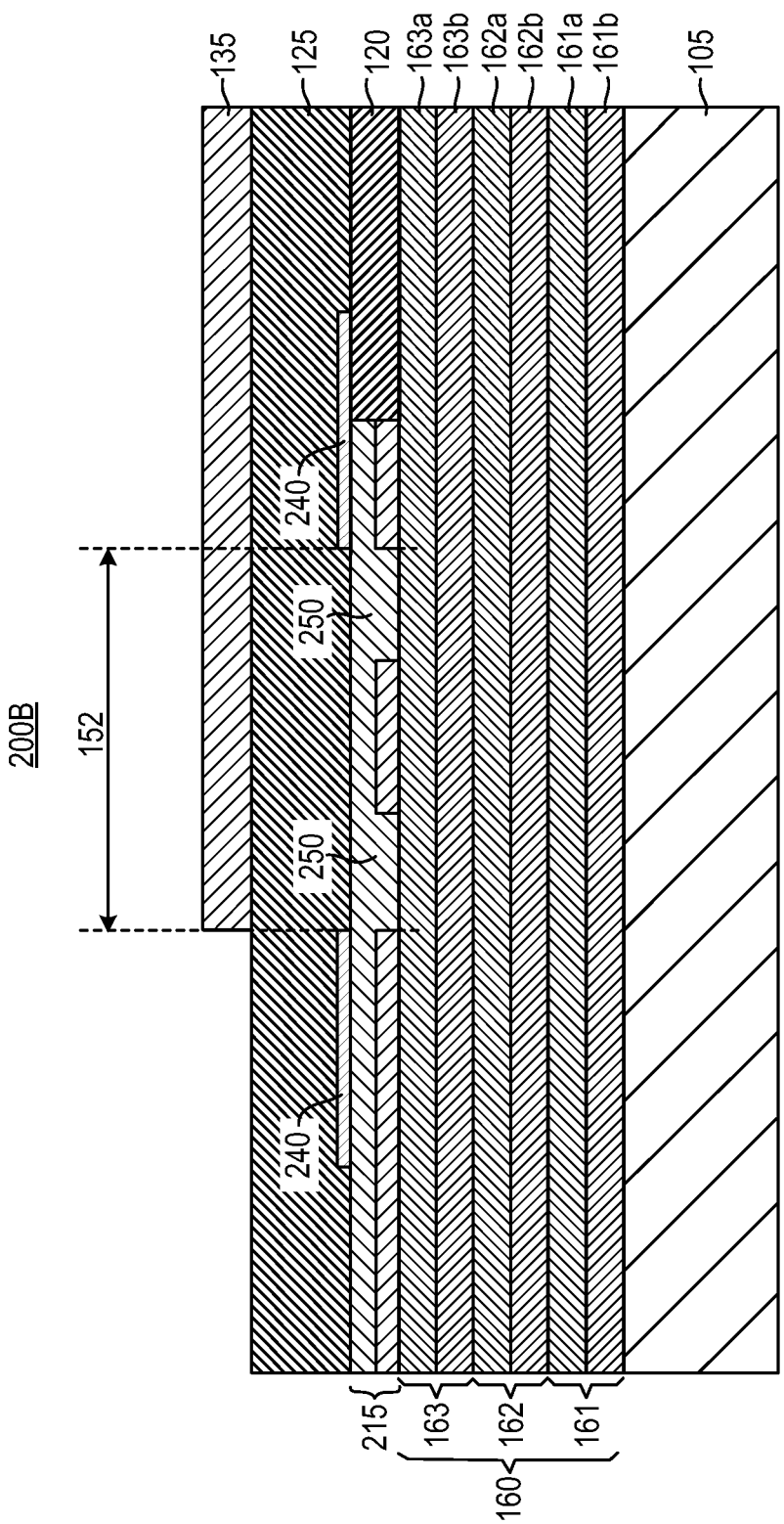
FIG. 2B is a cross-sectional view of an acoustic resonator according to another representative embodiment.
Figure 2C:
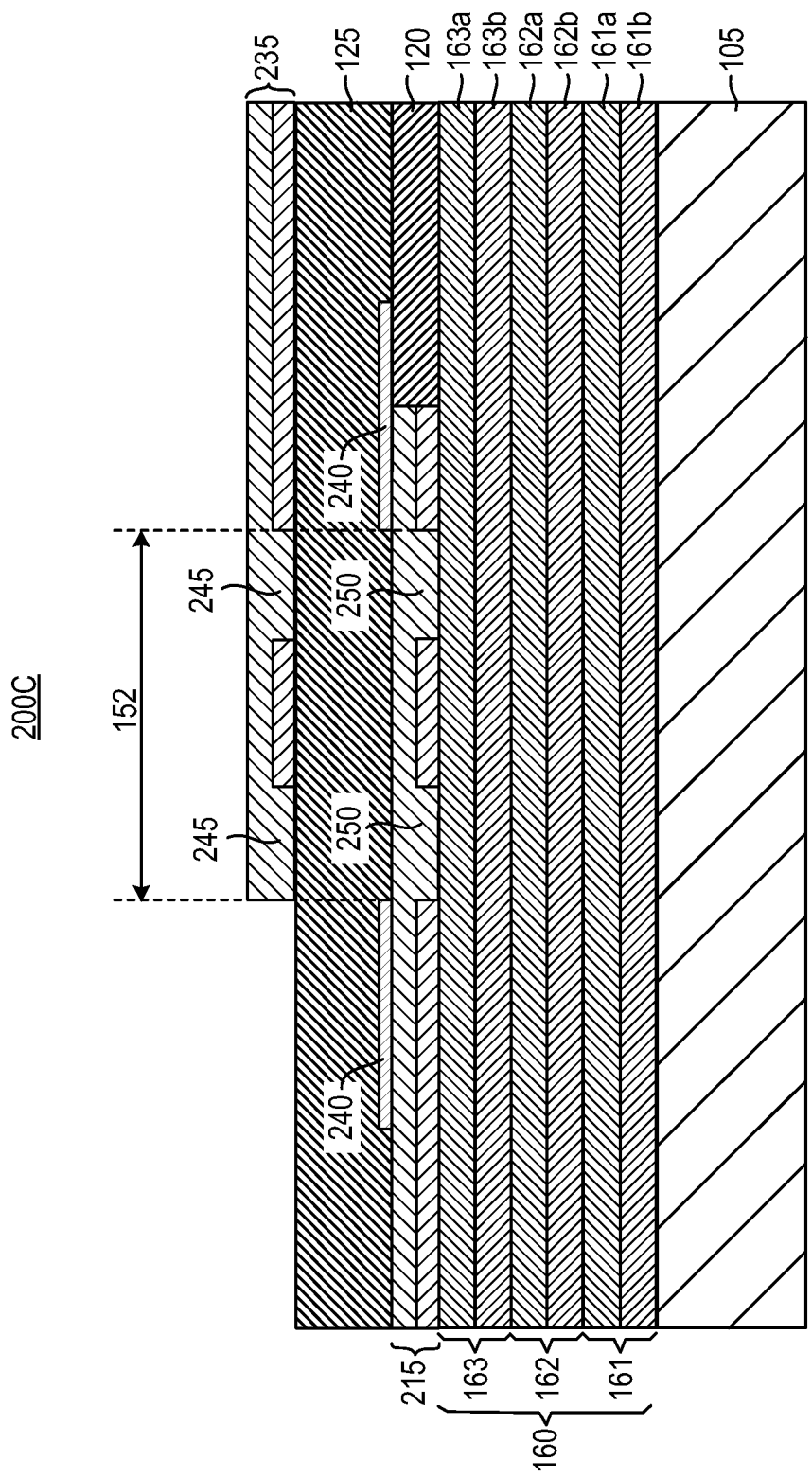
FIG. 2C is a cross-sectional view of an acoustic resonator according to another representative embodiment.
Figure 2D:
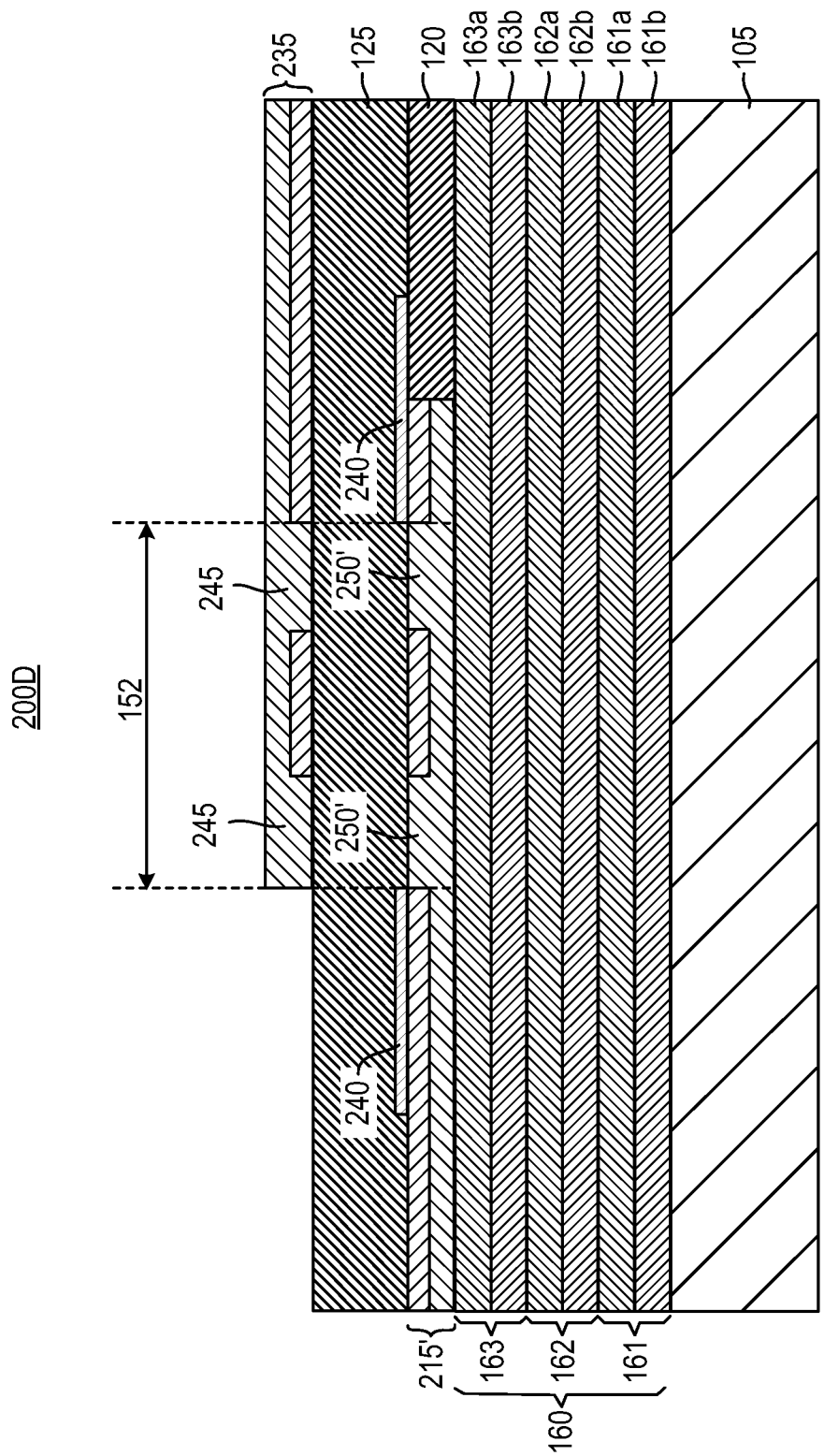
FIG. 2D is a cross-sectional view of an acoustic resonator according to another representative embodiment.

Note that for illustrative purposes, the frame 245 formed in the top electrode 235 and frames 250 and 250' formed in the bottom electrode 215 and 215' of the acoustic resonators 200A through 200D are constructed differently than the frame 145 of the top electrode 135 and the frames 150 and 150' formed in the bottom electrode 115 and 115' of the acoustic resonators 100B through 100F, respectively, although the functionality of the frames 245, 250 and 250' is substantially the same as discussed above with regard to the frames 145, 150 and 150'. In particular, the top electrode 235 in FIGS. 2A, 2C and 2D is a composite electrode comprising two different metal materials to provide integrated lateral features (frames 245). Likewise, the bottom electrodes 215, 215' in FIGS. 2B, 2C and 2D are also composite electrodes comprising two different metal materials to provide integrated lateral features (frames 250, 250').

Generally, the frame 245 comprises an inside electrode layer formed on the piezoelectric layer 125 and an outside electrode layer formed on the inside electrode layer. The outside electrode layer is formed of a first material and the inside electrode layer is formed of the first material and a second material, where the first material effectively extends from the outside electrode layer through the second material of the inside electrode layer to provide the frame 245 (in a bottom portion of the top electrode 235). The second material may have higher (lower) sound velocity than the first material in order to form a low (high) velocity frame. For example, for low velocity frame the second material may be formed of molybdenum (Mo) or aluminum (Al) and the first material may be tungsten (W), although other materials may be incorporated without departing from the scope of the present teachings. The frame 250 comprises an inside electrode layer formed beneath the piezoelectric layer 125 and an outside electrode layer formed beneath the inside electrode layer. The inside electrode layer is formed of the first material and the outside electrode layer is formed of the first and second materials, where the first material effectively extends from the inside electrode layer through the second material of the outside electrode layer to provide the frame 250 (in a bottom portion of the bottom electrode 215). Similarly, the frame 250' comprises an inside electrode layer formed beneath the piezoelectric layer 125 and an outside electrode layer formed beneath the inside electrode layer. The outside electrode layer is formed of the first material and the inside electrode layer is formed of the first and second materials, where the first material effectively extends from the outside electrode layer through the second material of the inside electrode layer to provide the frame 250' (in a top portion of the bottom electrode 215').

The frames may be realized by other types and locations of integrated lateral features formed by composite electrodes, without departing from the scope of the present teachings. Examples of composite electrodes with integrated lateral features are provided by U.S. patent application Ser. No. 13/660,941, filed Oct. 25, 2012 (issued as U.S. Pat. No. 9,425,764 on Aug. 23, 2016), which is hereby incorporated by reference in its entirety. Also, some general tradeoffs of different frame configurations are described, for instance, in the above cited U.S. patent application Ser. No. 13/663,449 (issued as U.S. Pat. No. 9,401,692 on Jul. 26, 2016). Of course, the structures of the frames 245, 250 and 250' may be applied to the acoustic resonators 100B through 100E, discussed above, and the structures of the frames 145, 150 and 150' may be applied to the acoustic resonators 200A through 200D, without departing from the scope of the present teachings.

In alternative embodiments, the various features of the acoustic resonators 100B through 200D may be provided in various combinations that include either a collar (of various types or locations) or one or more frames (of various types or locations), but not both collars and frames, without departing from the scope of the present teachings. For example, FIGS. 3A through 3D are cross-sectional views of acoustic resonators 300A through 300D, respectively, according to other representative embodiments, which include collars or frames, along with other illustrative features discussed above.

Figure 3A:
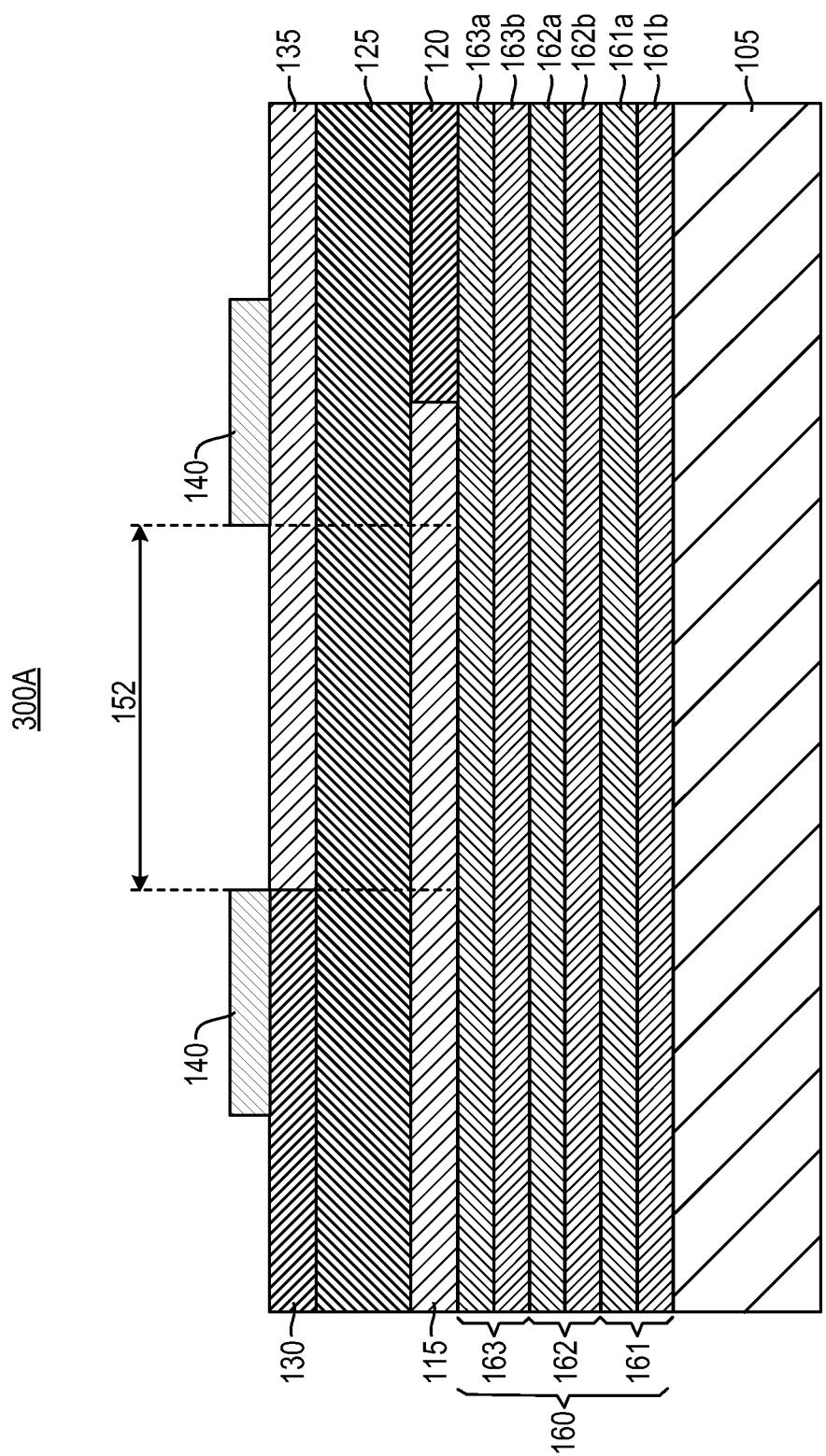
FIG. 3A is a cross-sectional view of an acoustic resonator, excluding frames, according to another representative embodiment.
Figure 3B:
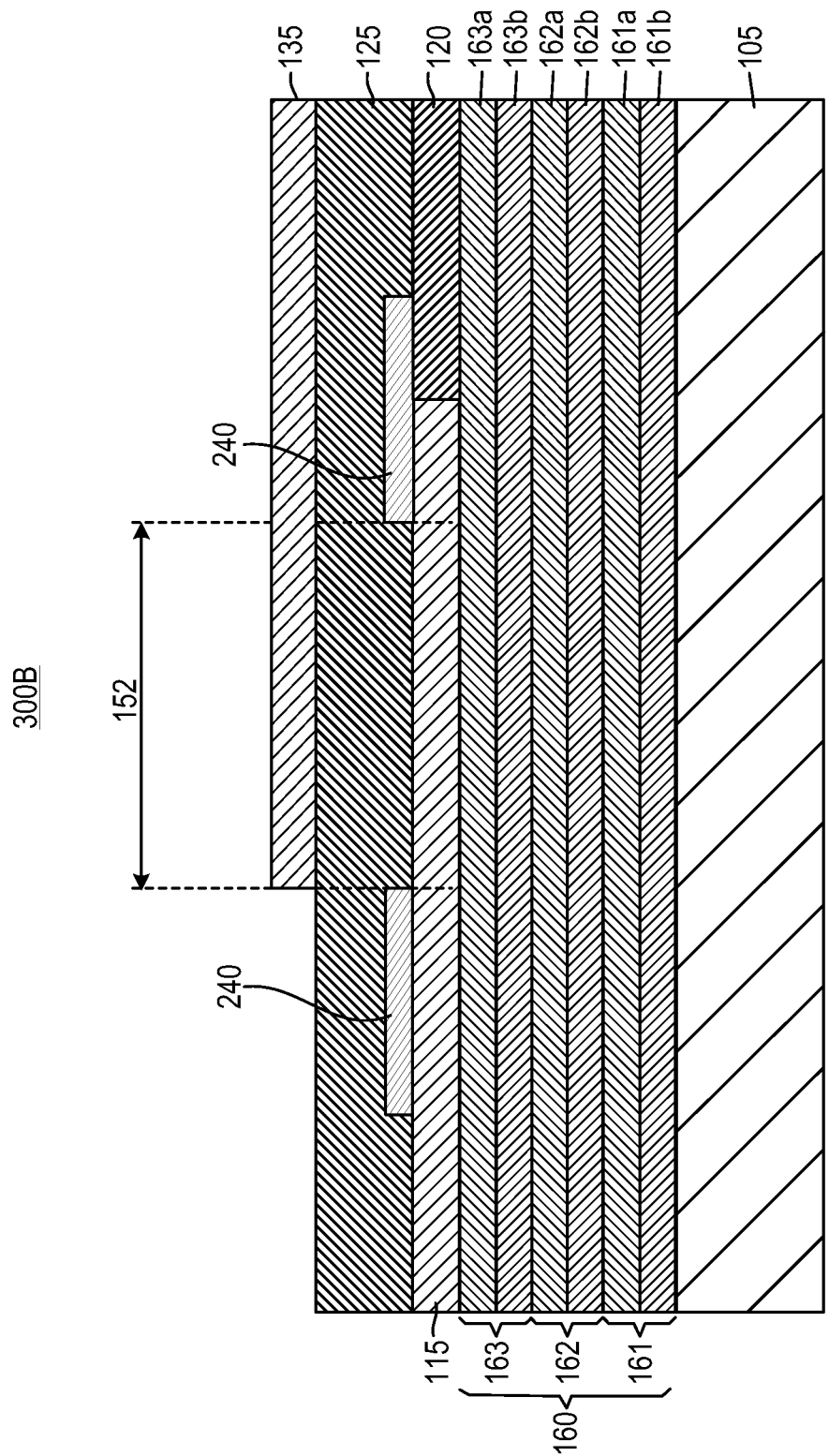
FIG. 3B is a cross-sectional view of an acoustic resonator, excluding frames, according to another representative embodiment.
Figure 3C:
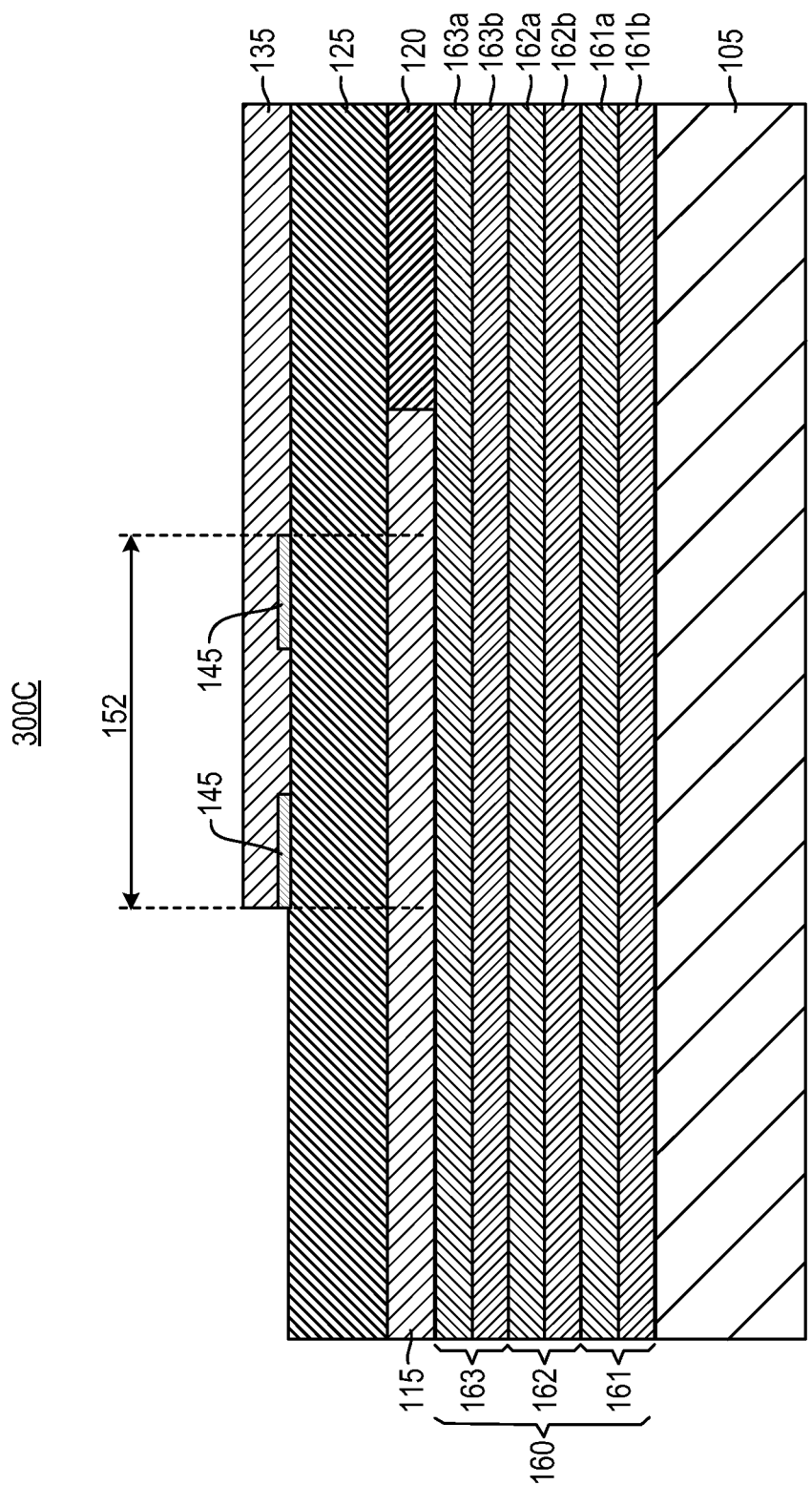
FIG. 3C is a cross-sectional view of an acoustic resonator, excluding collars, according to another representative embodiment.
Figure 3D:
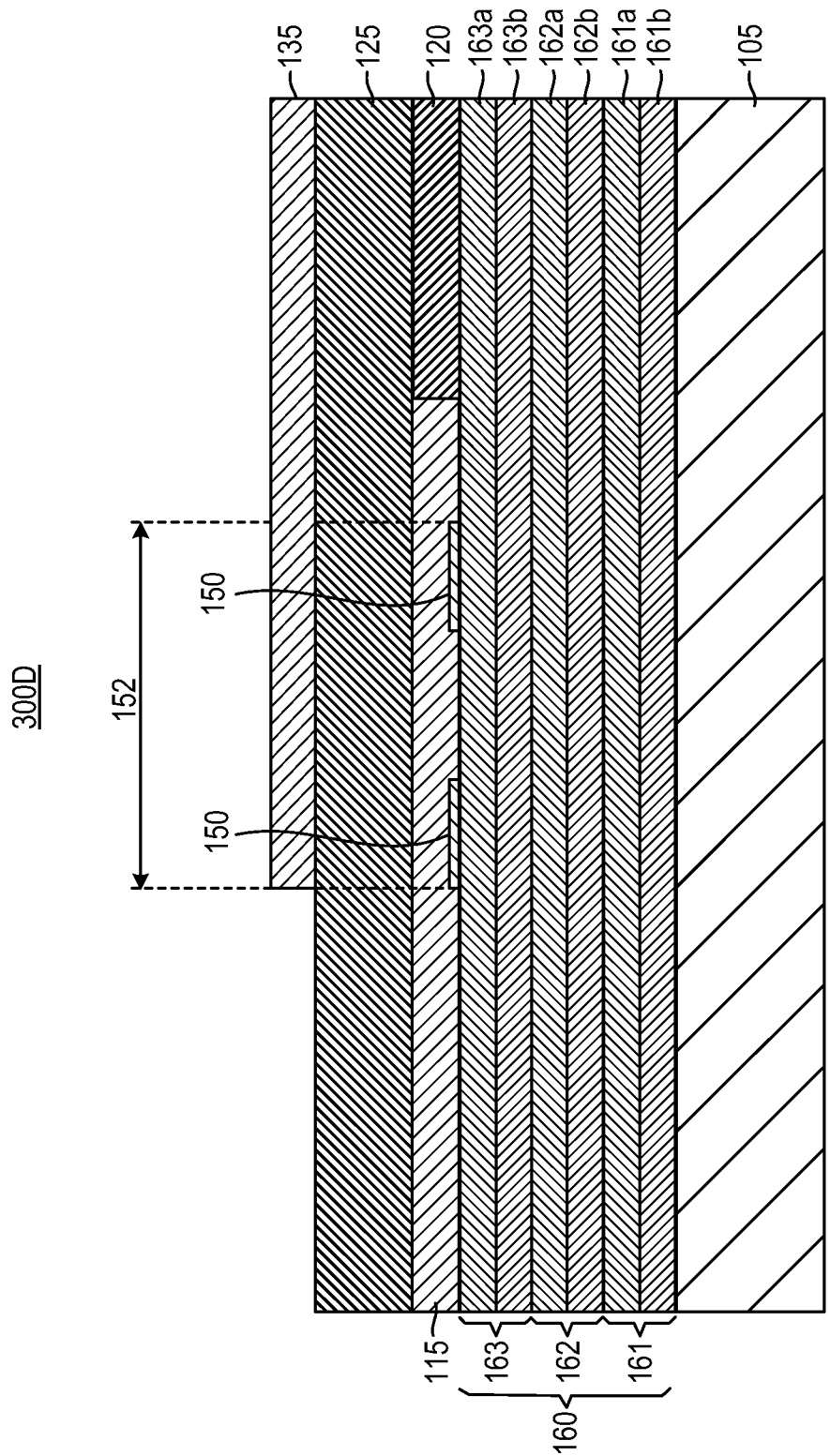
FIG. 3D is a cross-sectional view of an acoustic resonator, excluding collars, according to another representative embodiment.

Referring to FIG. 3A, the acoustic resonator 300A is a representative SMR that is similar to acoustic resonator 100B, except that it includes only the collar 140 in addition to the DBR 160 (with no frame). Similarly, referring to FIG. 3B, the acoustic resonator 300B is a representative SMR that is similar to acoustic resonator 200A, except that it includes only the collar 240 in addition to the DBR 160 (with no frame). Referring to FIG. 3C, the acoustic resonator 300C is a representative SMR that is similar to acoustic resonator 100B, except that it includes only the frame 145 in addition to the DBR 160 (with no collar). Similarly, referring to FIG. 3D, the acoustic resonator 300D is a representative SMR that is similar to acoustic resonator 100D, except that it includes only the frame 150 in addition to the DBR 160 (with no collar). Additional examples similar to acoustic resonators 300C and 300D are described in U.S. patent application Ser. No. 13/767,754 (filed Feb. 14, 2013) to Burak et al. (published as U.S. Patent App. Pub. No. 2014/0225682 on Aug. 14, 2014), mentioned above, which is hereby incorporated by reference in its entirety.

Of course, these are only examples of features. Other features and other combinations of features may be incorporated without departing from the scope of the present teachings. For example, the acoustic resonators 300C and/or 300D alternatively may include only frame 150', both frames 145 and 150, or both frames 145 and 150'. Also, various different arrangements and/or types of frames (e.g., frames 145, 150, 150', 245, 250, 250') (composite or add-on) and collars (e.g., collars 140, 240), as discussed above, may be incorporated, without departing from the scope of the present teachings. The DBRs, the frames, and the collars provide benefits similar to those discussed above, although performance and manufacture varies somewhat due to different locations and combinations.

Figure 4:
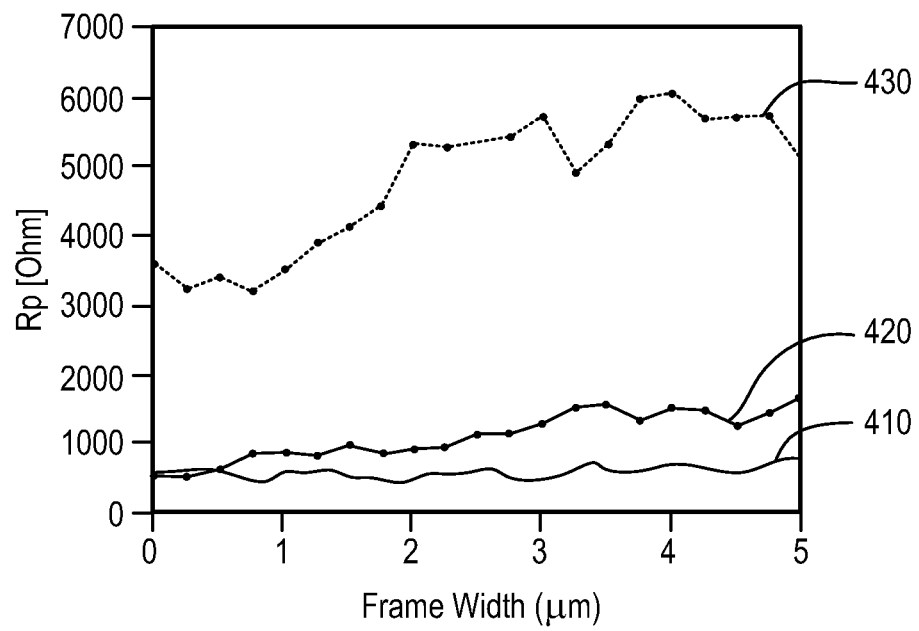
FIG. 4 is a graph illustrating parallel resistance Rp as a function of the presence of frames and/or collars, and of frame width, as compared to an acoustic resonator having no frames or collars, according to representative embodiments.

FIG. 4 is a graph illustrating parallel resistance Rp as a function of the presence of frames and/or collars, and of frame width, according to representative embodiments, as compared to an acoustic resonator having no frames or collars. That is, FIG. 4 illustrates simulated parallel resistance Rp versus frame widths (when a frame is present), as well as simulated parallel resistance Rp versus frame widths (when a frame and a collar are present) for purposes of comparing the acoustic resonator with an acoustic mirror (e.g., DBR 160). FIG. 4 thus illustrates changes in performance as indicated by the parallel resistances Rp that occur as a consequence of adding the frame 145 and the collar 140 to the acoustic resonator with a DBR 160, and varying the widths of the frame 145. Referring to FIG. 4, parallel resistance Rp is represented by the y-axis, and frame width is represented by an x-axis. The respective thicknesses of the frame 145 and the collar 140 are held constant, as discussed below. Thus, the values of the parallel resistance Rp vary as functions of the presence or absence of the frame 145 and/or the collar 140, and the widths of the frame 145.

In the example of FIG. 4, the dimensions of the acoustic resonator (e.g., acoustic resonator 100B) have been tuned for high parallel resistance Rp. In particular, bottom electrode 115 is formed of Mo with a thickness of approximately 3800 Å, piezoelectric layer 125 is formed of AlN with a thickness of approximately 9300 Å, top electrode 135 is formed of Mo with a thickness of approximately 3250 Å, and a passivation layer is formed of AlN (over the top electrode 135) with a thickness of approximately 2000 Å. With regard to alignments, an outer edge of the bottom electrode 115 extends approximately 14 μm outside the edge of the top electrode 135. Passivation and planarization layers are formed of sputtered SiN, for example.

Further, in the depicted example, the DBR 160 includes three stacked acoustic reflector layer pairs (e.g., first acoustic reflector layer pair 161, second acoustic reflector layer pair 162, and third acoustic reflector layer pair 163). Each of the first, second and third acoustic reflector layer pairs 161, 162 and 163 includes a low acoustic impedance layer (e.g., first, second and third low acoustic impedance layers 161a, 162a and 163a, respectively) formed of plasma-enhanced chemical vapor deposition SiC with a thickness of approximately 5800 Å. Each of the first, second and third acoustic reflector layer pairs 161, 162 and 163 also includes a high acoustic impedance layer (e.g., first, second and third high acoustic impedance layers 161b, 162b and 163b, respectively) formed of tungsten (W) with a thickness of approximately 5500 Å, on which the first, second and third low acoustic impedance layers 161a, 162a and 163a are stacked, respectively. The thicknesses of the low and high acoustic impedance layers are optimized for best parallel resistance Rp for the particular scenarios. Optimizing acoustic impedance layers of an acoustic reflector is described, for example, by U.S. patent application Ser. No. 13/767,754 (filed Feb. 14, 2013) (published as U.S. Patent App. Pub. No. 2014/0225682 on Aug. 14, 2014), to Burak et al., which is hereby incorporated by reference in its entirety. Thus, each of the first, second and third low acoustic impedance layers 161a, 162a and 163a may be designed to operate at a series resonance frequency of about 2.75 GHz, and each of the first, second and third high acoustic impedance layers 161b, 162b and 163b may be designed to operate at a series resonance frequency of about 2.4 GHz.

FIG. 4 depicts three configurations, each of which is indicated by a corresponding Rp value curve. In particular, curve 410 illustrates the Rp values of a bare resonator (SMR) with the DBR 160, but with no frame and no collar, and is serves as a baseline for comparisons. This design generally corresponds to acoustic resonator 300C shown in FIG. 3C without the frame 145. Curve 420 illustrates the Rp values of the acoustic resonator with the DBR 160 and the frame 145 and no collar, which generally corresponds to the acoustic resonator 300C shown in FIG. 3C. Curve 430 illustrates the Rp values of the acoustic resonator with the DBR 160, the frame 145 and the collar 140, which generally corresponds to the acoustic resonator 100B. The frame 145 (when included) is a composite frame formed of AlN embedded in the Mo at the bottom of the top electrode 135, and has a thickness of approximately 350 Å. The frame 145 varies in width from 0 to approximately 5.0 μm. The collar 140 (when included) is formed of sputtered SiC on the top electrode 135 and has a thickness of approximately 9450 Å (i.e., about 4200 Å thicker than the top electrode 135 and the passivation layer) and a width of approximately 11.5 μm.

Referring to FIG. 4, it is apparent that including the combination of all features (DBR 160, frame 145 and collar 140) in the acoustic resonator improves performance of the acoustic resonator as measured by the value of parallel resistance Rp. For example, curve 410 indicates that the parallel resistance Rp essentially stays constant at about 500 ohms, as expected (small variations are related to numerical errors in the simulations due to finite simulation grid). Curve 420 indicates that adding the frame 145 increases parallel resistance Rp by up to three times, from about 500 ohms to about 1700 ohms, e.g., when the frame is approximately 5.0 µm wide. Curve 430 indicates that adding the collar 140 increases the parallel resistance Rp about another three and a half times, from about 1700 ohms to about 6100 ohms (about a 12 times increase in parallel resistance Rp overall) when the frame 145 is approximately 4 µm wide). Curve 430 further indicates that adding only the collar 140, as shown in FIG. 3A (with no frame 145, indicated in FIG. 4 by a frame width equal to 0), increases the parallel resistance Rp by more than seven times, from about 500 ohms to about 3600 ohms. As should be appreciated by one of ordinary skill in the art, the parallel resistance Rp values of the acoustic resonator with the frame 145 and/or the collar 140, according to various embodiments, increase (without significant degradation of the bandwidth) as compared to the acoustic resonator with only the DBR 160.

Figure 5:
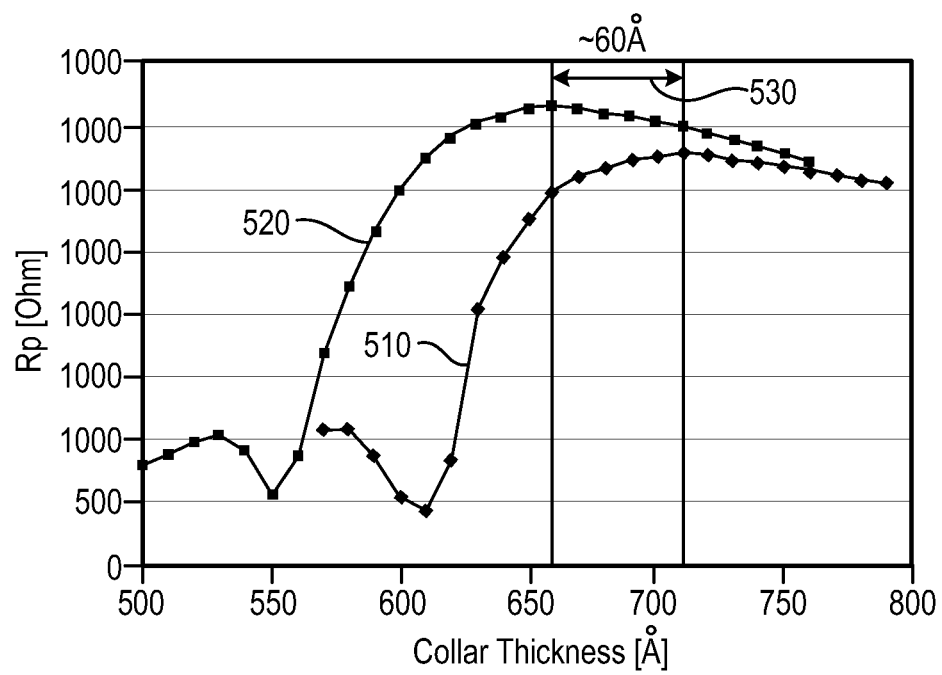
FIG. 5 is a graph illustrating parallel resistance Rp as a function of floating and grounded collar thicknesses of the acoustic resonator of FIG. 3A, according to representative embodiments.

FIG. 5 is a graph illustrating parallel resistance Rp as a function of electrically floating and electrically grounded collars made of tungsten (W) and collar thicknesses of the acoustic resonator of FIG. 3A according to representative embodiments. That is, FIG. 5 illustrates simulated parallel resistance Rp and collar thickness comparisons of acoustic resonators with an acoustic mirror (e.g., DBR 160), with electrically floating and electrically grounded collars (e.g., collar 140), as are shown in FIG. 3A, for example. The purpose of these graphs is to illustrate changes in performance as indicated by the parallel resistances Rp that occur as a consequence of electrically grounding the collar 140 for varying thicknesses of the collar 140. Referring to FIG. 5, parallel resistance Rp is represented by the y-axis, and collar thickness is represented by an x-axis. Thus, the values of the parallel resistance Rp are shown as functions of the thicknesses of the collar 140, and of whether the collar 140 is floating or grounded.

In the example of FIG. 5, the dimensions of the acoustic resonator (e.g., acoustic resonator 300A) have been tuned for high parallel resistance Rp. In particular, bottom electrode 115 is formed of Mo with a thickness of approximately 3800 Å, piezoelectric layer 125 is formed of AlN with a thickness of approximately 9300 Å, top electrode 135 is formed of Mo with a thickness of approximately 3250 Å, and a passivation layer is formed of AlN (over the top electrode 135) with a thickness of approximately 2000 Å. With regard to alignments, an outer edge of the bottom electrode 115 extends approximately 14 µm outside the edge of the top electrode 135. Passivation and planarization layers are formed of sputtered SiN, for example.

Further, in the example, the DBR 160 includes three stacked acoustic reflector layer pairs (e.g., first acoustic reflector layer pair 161, second acoustic reflector layer pair 162, and third acoustic reflector layer pair 163). Each of the first, second and third acoustic reflector layer pairs 161, 162 and 163 includes a low acoustic impedance layer (e.g., first, second and third low acoustic impedance layers 161a, 162a and 163a, respectively) formed of plasma-enhanced chemical vapor deposition SiC with a thickness of approximately 5800 Å. Each of the first, second and third acoustic reflector layer pairs 161, 162 and 163 also includes a high acoustic impedance layer (e.g., first, second and third high acoustic impedance layers 161b, 162b and 163b, respectively) formed of W with a thickness of approximately 5500 Å, on which the first, second and third low acoustic impedance layers 161a, 162a and 163a are stacked, respectively. The thicknesses of the low and high acoustic impedance layers are optimized for best parallel resistance Rp for the particular scenarios, as discussed above. Thus, each of the first, second and third low acoustic impedance layers 161a, 162a and 163a may operate at a series resonance frequency of about 2.75 GHz, and each of the first, second and third high acoustic impedance layers 161b, 162b and 163b may operate at a series resonance frequency of about 2.4 GHz.

FIG. 5 depicts two configurations, each of which is indicated by a corresponding Rp value curve. In particular, curve 510 illustrates the Rp values of the acoustic resonator with the DBR 160 and the collar 140, which generally corresponds to the acoustic resonator 300A, where the collar 140 is electrically floating. Curve 520 illustrates the Rp values of the acoustic resonator with the DBR 160 and the same collar 140, where the collar 140 is electrically grounded (or shorted to the bottom electrode 115). With respect to both curves, the collar 140 is formed of W on the top planarization and passivation layers of a combined thickness of approximately 5960 Å and a width of approximately 11.5 µm.

Referring to FIG. 5, it is apparent that electrically grounding the collar 140, included with the DBR 160 in the acoustic resonator, improves performance of the acoustic resonator. In general, in comparing the curves 510 and 520, it is apparent that the parallel resistance Rp versus collar thickness characteristics for electrically floating and electrically grounded collars 140 are very similar. However, because of cut-off frequency down-shift due to shorting of the piezoelectric layer 125 (curve 520), both curves 510 and 520 are shifted with respect to each other but approximately 60 Angstroms, indicated by double-headed arrow 530. As should be appreciated by one of ordinary skill in the art, the parallel resistance Rp versus collar thickness characteristics of the SMRs are similar to those of FBARs with dielectric collars. The dip in parallel resistance Rp in each of the curves 510 and 520 (to about 500 ohms) is related to alignment of the cut-off frequency of the collar 140 with parallel resonance frequency Fp of the SMR (e.g., acoustic resonator 300A). As thickness of the collar 140 increases, the parallel resistances Rp indicated by the curves 510 and 520 likewise initially increase until they peak when the cut-off frequency of the collar 140 and the serial resonance frequency Fs of the SMR are substantially aligned. As the thickness of the collar 140 continues to increase, the parallel resistances Rp slowly decrease due to increased mismatch between the piston mode in the main active region and eTE1 mode in the respective collar regions.

Notably, the electrically grounded collar 140 (curve 520) yields approximately 10 to 15 percent better parallel resistance Rp than the electrically floating collar 140. Generally, the electrically floating collar 140 simply creates a mass-loaded structure outside of the top electrode 135. Notably, the electrically floating collar 140 should be removed from over the connecting edge of the top electrode 135, or otherwise it will become biased and essentially extend the acoustic resonator 300A laterally, actually reducing rather than improving performance. Also, the electrically floating collar 140 should not overlap with top electrode 135 on all non-connecting regions, for the same reason. In comparison, the electrically grounded collar 140 (which may also be referred to as a guard-ring) creates a zero E-field region outside of the top electrode 135, in addition to providing mass-loading. However, the electrically grounded collar 140 requires additional processing to connect it to the bottom electrode 115, as would be apparent to one of ordinary skill in the art.

In the above-described embodiments, high and low acoustic impedance layers of the DBRs, the collars and the frames can generally be formed using conventional processing techniques, with examples including various forms of deposition, sputtering, etching, polishing, and so on. Moreover, the described embodiments and related methods of fabrication can be modified in various ways as will be apparent to those skilled in the art.

In accordance with various embodiments, an SMR comprising a DBR combined with one or more frames and/or collars create weakly confined structures that minimize parasitic scattering of electrically excited piston mode, and therefore create acoustically lossless acoustic resonator. Generally, the collar couples piston mode and eTE1 mode of the main active region to evanescent mode of the collar region, the DBR effectively minimizes coupling of piston mode of the main active region and coupling of the eTE1 mode of the collar to the resonator substrate, and the frame (e.g., composite frame) suppresses excitation of propagating modes.

In a representative embodiment, an SMR device includes a substrate, an acoustic reflector disposed on a top surface of the substrate, an acoustic stack mounted on a top surface of the acoustic reflector, and a collar arranged outside a main active region of the acoustic stack. The acoustic reflector has multiple acoustic reflector layer pairs. The acoustic stack includes a piezoelectric layer sandwiched between bottom and top electrode layers, and the main active region is defined by an overlap between the bottom electrode, the piezoelectric layer and the top electrode. The collar defines a collar region having a cutoff frequency that is substantially the same as a cutoff frequency of the main active region.

In another representative embodiment, an SMR device includes a substrate, an acoustic reflector disposed on a top surface of the substrate, an acoustic stack mounted on a top surface of the DBR, and a composite frame arranged inside a main active region of the acoustic stack. The acoustic reflector has multiple acoustic reflector layer pairs. The acoustic stack includes a piezoelectric layer sandwiched between bottom and top electrode layers, and the main active region is defined by an overlap between the bottom electrode, the piezoelectric layer and the top electrode. An outer edge of the frame is substantially aligned with the boundary of the main active region.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A solidly mounted resonator (SMR) device, comprising:
   an acoustic reflector disposed on a substrate, the acoustic reflector comprising a plurality of stacked acoustic reflector layer pairs, each acoustic reflector layer pair comprising a low acoustic impedance layer formed of low acoustic impedance material stacked on a high acoustic impedance layer formed of high acoustic impedance material;
   a bottom electrode disposed on the low acoustic impedance layer of a top acoustic impedance layer pair of the acoustic reflector;
   a piezoelectric layer disposed on the bottom electrode;
   a top electrode disposed on the piezoelectric layer;
   a collar formed outside a main active region defined by an overlap between the top electrode, the piezoelectric layer and the bottom electrode, the collar having an inner edge substantially aligned with a boundary of or overlapping the main active region; and
   at least one frame disposed within the main active region and having an outer edge substantially aligned with the boundary of the main active region,
   wherein the collar defines a collar region having a cutoff frequency that is substantially the same as a cutoff frequency of the main active region, and
   wherein the collar is formed on a top surface of the top electrode and a planarization layer adjacent the top electrode or on a top surface of the bottom electrode between the bottom electrode and the piezoelectric layer.

2. The SMR device of claim 1, wherein the low acoustic impedance material comprises borosilicate glass (BSG) or tetra-ethyl-ortho-silicate (TEOS).

3. The SMR device of claim 1, wherein the collar comprises borosilicate glass, silicon dioxide, carbon-doped silicon oxide, silicon carbide, silicon nitride, aluminum oxide, aluminum nitride, zinc oxide, lead zirconium titanate, diamond, diamond-like carbon, tungsten, molybdenum or iridium.

4. The SMR device of claim 1, wherein the at least one frame comprises copper, molybdenum, aluminum, tungsten, iridium, borosilicate glass, carbon-doped silicon oxide, silicon carbide, silicon nitride, aluminum oxide, aluminum nitride, zinc oxide, lead zirconium titanate, diamond or diamond-like carbon.

5. The SMR device of claim 1, wherein the piezoelectric layer is doped with at least one rare earth element.

6. The SMR device of claim 1, wherein the low acoustic impedance material of at least one of the plurality of stacked acoustic reflector layer pairs comprises a temperature compensating material having a positive temperature coefficient for offsetting at least a portion of negative temperature coefficients of the piezoelectric layer, the bottom electrode and the top electrode.

7. A solidly mounted resonator (SMR) device, comprising:
   an acoustic reflector disposed on a substrate, the acoustic reflector comprising a plurality of stacked acoustic reflector layer pairs, each acoustic reflector layer pair comprising a low acoustic impedance layer formed of low acoustic impedance material stacked on a high acoustic impedance layer formed of high acoustic impedance material;
   a bottom electrode disposed on the low acoustic impedance layer of a top acoustic impedance layer pair of the acoustic reflector;
   a piezoelectric layer disposed on the bottom electrode;
   a top electrode disposed on the piezoelectric layer;
   a collar formed outside a main active region defined by an overlap between the top electrode, the piezoelectric layer and the bottom electrode, the collar having an inner edge substantially aligned with a boundary of or overlapping the main active region, wherein at least a portion of the collar is formed on a top surface of the bottom electrode or on a top surface of the top electrode; and at least one frame disposed within the main active region and having an outer edge substantially aligned with the boundary of the main active region, wherein the collar defines a collar region having a cutoff frequency that is substantially the same as a cutoff frequency of the main active region, and wherein the collar is an electrically grounded collar.

8. A solidly mounted resonator (SMR) device, comprising:
an acoustic reflector disposed on a substrate, the acoustic reflector comprising a plurality of stacked acoustic reflector layer pairs, each acoustic reflector layer pair comprising a low acoustic impedance layer formed of low acoustic impedance material stacked on a high acoustic impedance layer formed of high acoustic impedance material;
a bottom electrode disposed on the low acoustic impedance layer of a top acoustic impedance layer pair of the acoustic reflector;
a piezoelectric layer disposed on the bottom electrode;
a top electrode disposed on the piezoelectric layer;
a collar formed outside a main active region defined by an overlap between the top electrode, the piezoelectric layer and the bottom electrode, the collar having an inner edge substantially aligned with a boundary of or overlapping the main active region, wherein at least a portion of the collar is formed on a top surface of the bottom electrode or on a top surface of the top electrode; and
at least one frame disposed within the main active region and having an outer edge substantially aligned with the boundary of the main active region, wherein the at least one frame comprises a frame disposed at a bottom portion of the top electrode.

9. The SMR device of claim 8, wherein the frame disposed at the bottom portion of the top electrode comprises an add-on frame.

10. The SMR device of claim 8, wherein the frame disposed at the bottom portion of the top electrode comprises a composite frame.

11. The SMR device of claim 8, wherein the at least one frame comprises another frame disposed at one of a top portion or a bottom portion of the bottom electrode.

12. The SMR device of claim 8, wherein the piezoelectric layer is doped with at least one rare earth element.

13. The SMR device of claim 8, wherein the low acoustic impedance material of at least one of the plurality of stacked acoustic reflector layer pairs comprises a temperature compensating material having a positive temperature coefficient for offsetting at least a portion of negative temperature coefficients of the piezoelectric layer, the bottom electrode and the top electrode.

14. A solidly mounted resonator (SMR) device, comprising:
an acoustic reflector disposed on a substrate, the acoustic reflector comprising a plurality of stacked acoustic reflector layer pairs, each acoustic reflector layer pair comprising a low acoustic impedance layer formed of low acoustic impedance material stacked on a high acoustic impedance layer formed of high acoustic impedance material;
a bottom electrode disposed on the low acoustic impedance layer of a top acoustic impedance layer pair of the acoustic reflector;
a piezoelectric layer disposed on the bottom electrode;
a top electrode disposed on the piezoelectric layer;
a collar formed outside a main active region defined by an overlap between the top electrode, the piezoelectric layer and the bottom electrode, the collar having an inner edge substantially aligned with a boundary of or overlapping the main active region, wherein at least a portion of the collar is formed on a top surface of the bottom electrode or on a top surface of the top electrode; and
at least one frame disposed within the main active region and having an outer edge substantially aligned with the boundary of the main active region, wherein the at least one frame comprises a frame disposed at a bottom portion of the bottom electrode.

15. The SMR device of claim 14, wherein the piezoelectric layer is doped with at least one rare earth element.

16. The SMR device of claim 14, wherein the low acoustic impedance material of at least one of the plurality of stacked acoustic reflector layer pairs comprises a temperature compensating material having a positive temperature coefficient for offsetting at least a portion of negative temperature coefficients of the piezoelectric layer, the bottom electrode and the top electrode.

17. A solidly mounted resonator (SMR) device, comprising:
a substrate;
a distributed Bragg reflector (DBR) disposed on a top surface of the substrate, the DBR comprising a plurality of acoustic reflector layer pairs;
an acoustic stack mounted on a top surface of the DBR, the acoustic stack comprising a piezoelectric layer sandwiched between bottom and top electrode layers, and having a main active region defined by an overlap between the bottom electrode, the piezoelectric layer, and the top electrode; and
a collar arranged outside the main active region, and at least a portion of the collar being arranged outside an outer edge of the top electrode, the collar defining a collar region having a cutoff frequency that is substantially the same as a cutoff frequency of the main active region,
wherein the collar is formed on one of a top surface of the bottom electrode and a first planarization layer adjacent the bottom electrode, or a top surface of the top electrode and a second planarization layer adjacent the top electrode.

18. A solidly mounted resonator (SMR) device, comprising:
a substrate;
a distributed Bragg reflector (DBR) disposed on a top surface of the substrate, the DBR comprising a plurality of acoustic reflector layer pairs;
an acoustic stack mounted on a top surface of the DBR, the acoustic stack comprising a piezoelectric layer sandwiched between bottom and top electrode layers, and having a main active region defined by an overlap between the bottom electrode, the piezoelectric layer, and the top electrode; and
at least one frame arranged inside the main active region, an outer edge of the at least one frame substantially aligned with the boundary of the main active region,
wherein the at least one frame is in at least one of the bottom and top electrode layers, and comprises an inside electrode layer adjacent the piezoelectric layer and an outside electrode layer adjacent the inside electrode layer, the outside electrode layer being formed of a first material and the inside electrode layer being formed of the first material and a second material, wherein the first material extends from the outside electrode layer through the second material of the inside electrode layer to provide the at least one frame.

19. The SMR device of claim 18, wherein the second material has a higher sound velocity than the first material, such that the at least one frame comprises a low velocity frame.

20. The SMR device of claim 18, wherein the second material has a lower sound velocity than the first material, such that the at least one frame comprises a high velocity frame.

\* \* \* \* \*